US012062574B2

(12) United States Patent
He et al.

(10) Patent No.: US 12,062,574 B2
(45) Date of Patent: Aug. 13, 2024

(54) INTEGRATED CIRCUIT STRUCTURE WITH THROUGH-METAL THROUGH-SUBSTRATE INTERCONNECT AND METHOD

(71) Applicant: GLOBALFOUNDRIES U.S. Inc., Malta, NY (US)

(72) Inventors: Zhong-Xiang He, Essex Junction, VT (US); Richard J. Rassel, Essex Junction, VT (US); Alvin J. Joseph, Williston, VT (US); Ramsey M. Hazbun, Colchester, VT (US); Jeonghyun Hwang, Ithaca, NY (US); Mark D. Levy, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 305 days.

(21) Appl. No.: 17/389,779

(22) Filed: Jul. 30, 2021

(65) Prior Publication Data

US 2023/0034728 A1 Feb. 2, 2023

(51) Int. Cl.
*H01L 21/768* (2006.01)
*H01L 21/8234* (2006.01)
(Continued)

(52) U.S. Cl.
CPC .......... *H01L 21/76898* (2013.01); *H01L 21/823475* (2013.01); *H01L 23/481* (2013.01); *H01L 29/66462* (2013.01); *H01L 29/7786* (2013.01)

(58) Field of Classification Search
CPC ....... H01L 21/76898; H01L 21/823475; H01L 23/481; H01L 29/66462; H01L 29/41766
See application file for complete search history.

(56) References Cited

U.S. PATENT DOCUMENTS 4,624,004 A   11/1986 Calviello
7,563,714 B2   7/2009 Erturk et al.
(Continued)

FOREIGN PATENT DOCUMENTS

KR   20170048127 A  *  5/2017

OTHER PUBLICATIONS

S. Russo and A. Di Carlo, "Influence of the Source-Gate Distance on the AlGaN/GaN HEMT Performance," in IEEE Transactions on Electron Devices, vol. 54, No. 5, pp. 1071-1075, May 2007, doi: 10.1109/TED.2007.894614.*
(Continued)

*Primary Examiner* — Yara B Green
*Assistant Examiner* — Fakeha Sehar
(74) *Attorney, Agent, or Firm* — Francois Pagette; Hoffman Warnick LLC

(57) ABSTRACT

Disclosed is an integrated circuit (IC) structure that includes a through-metal through-substrate interconnect. The interconnect extends essentially vertically through a device level metallic feature on a frontside of a substrate, extends downward from the device level metallic feature into or completely through the substrate (e.g., to contact a backside metallic feature below), and extends upward from the device level metallic feature through interlayer dielectric (ILD) material (e.g., to contact a BEOL metallic feature above). The device level metallic feature can be, for example, a metallic source/drain region of a transistor, such as a high electron mobility transistor (HEMT) or a metal-insulator-semiconductor high electron mobility transistor (MISH-EMT), which is formed on the frontside of the substrate. The backside metallic feature can be a grounded metal layer. The BEOL metallic feature can be a metal wire in one of the BEOL metal levels. Also disclosed is an associated method.

20 Claims, 14 Drawing Sheets

(51) Int. Cl.
  *H01L 23/48*  (2006.01)
  *H01L 29/66*  (2006.01)
  *H01L 29/778*  (2006.01)

(56) References Cited

U.S. PATENT DOCUMENTS

| | | |
|---|---|---|
| 8,304,916 B1 | 11/2012 | Sarkozy et al. |
| 9,093,503 B1 | 7/2015 | Chen et al. |
| 9,502,627 B2 | 11/2016 | Yu et al. |
| 10,174,439 B2 | 1/2019 | Fenwick et al. |
| 2006/0091498 A1* | 5/2006 | Sriram .............. H01L 29/66863 |
| | | 257/E27.012 |
| 2007/0200134 A1* | 8/2007 | Therrien ................ H01L 23/481 |
| | | 257/E29.338 |
| 2009/0001478 A1* | 1/2009 | Okamoto ............ H01L 29/4175 |
| | | 257/E21.627 |
| 2010/0295100 A1* | 11/2010 | Huang .................. H01L 29/812 |
| | | 257/256 |
| 2014/0335666 A1* | 11/2014 | Koehler ............ H01L 21/02661 |
| | | 438/172 |
| 2015/0243848 A1 | 8/2015 | Huang |
| 2018/0358458 A1* | 12/2018 | Iucolano ............. H01L 29/1066 |

OTHER PUBLICATIONS

Machine Translation KR-20170048127-A (May 8, 2017) (Year: 2017).*

* cited by examiner

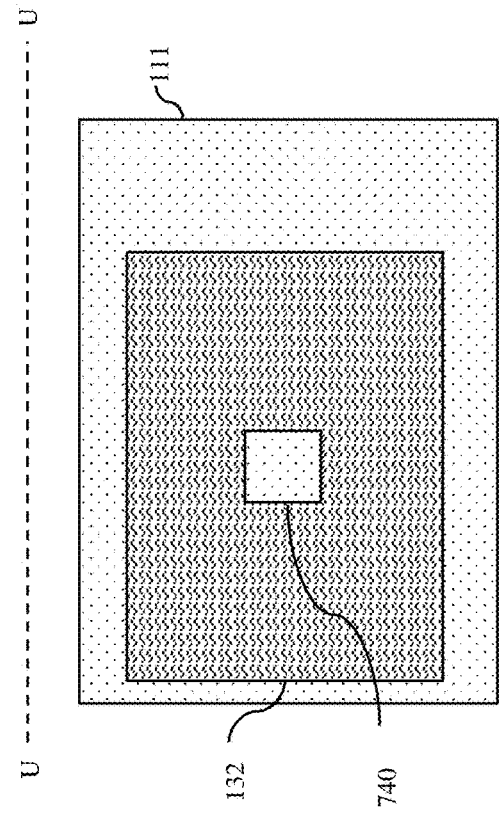
FIG. 7A(2)
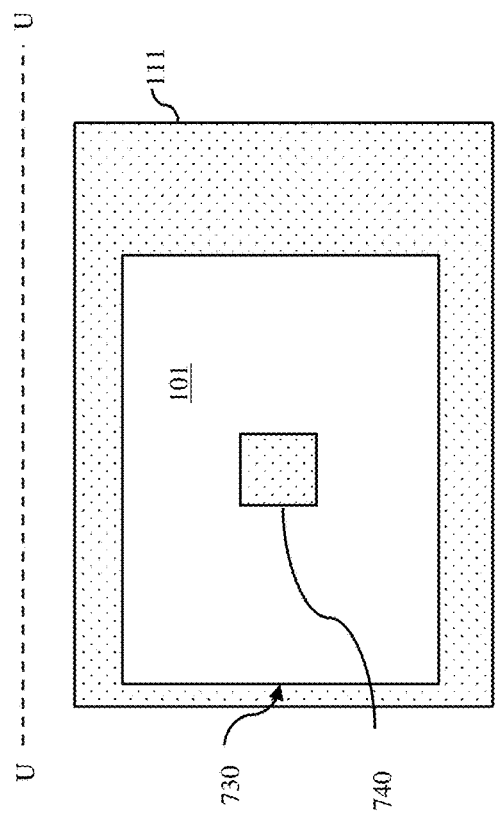
FIG. 7B(2)
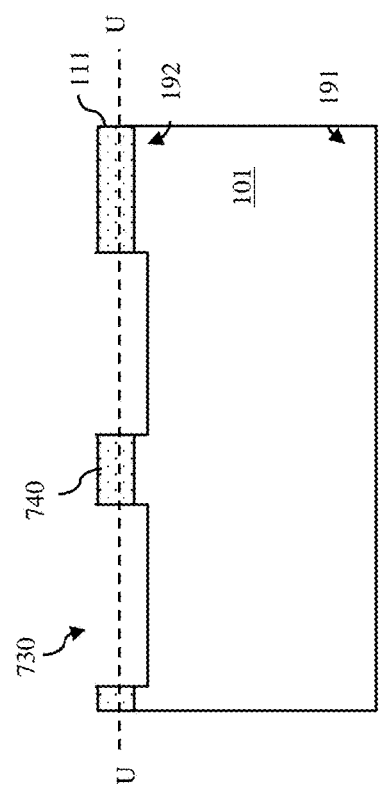
FIG. 7A(1)
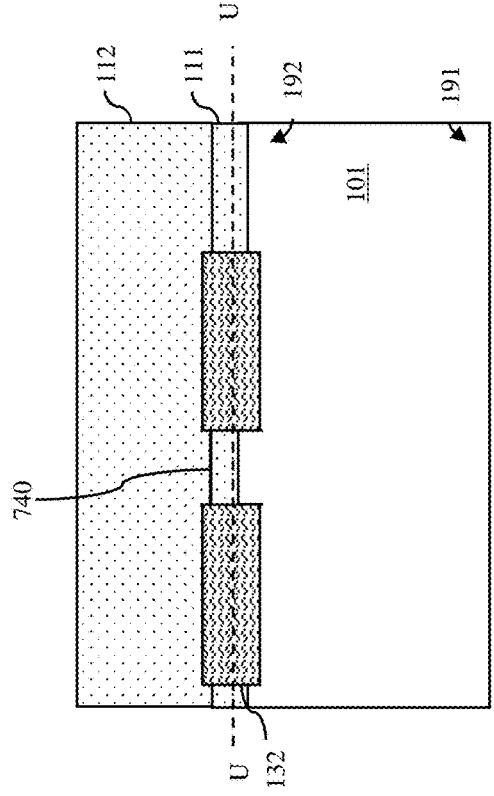
FIG. 7B(1)

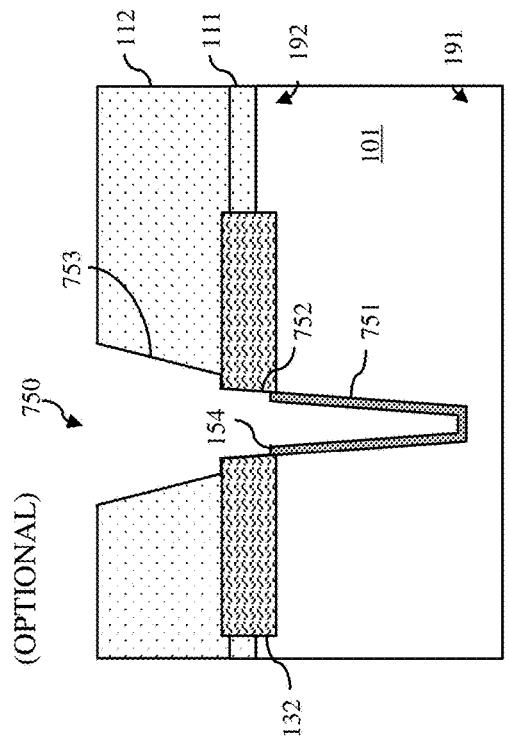
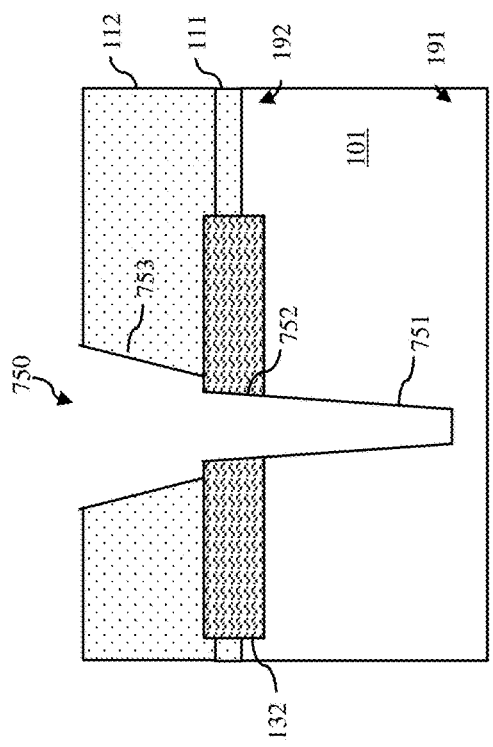
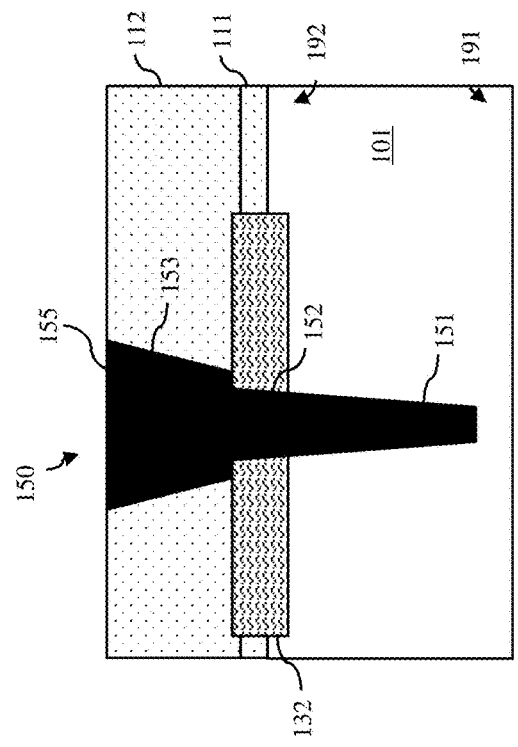

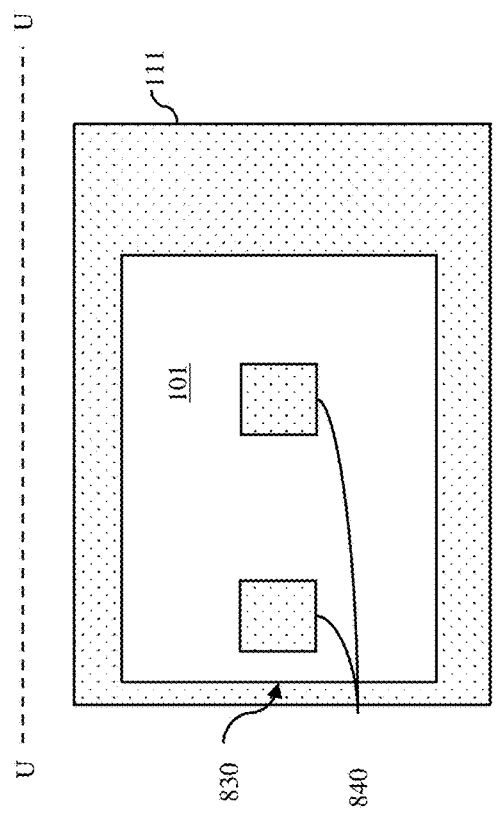# 
FIG. 8A(1)
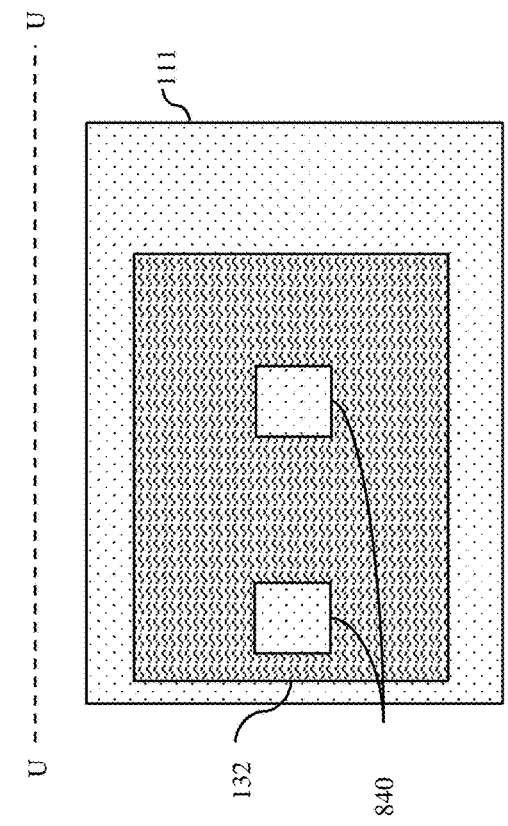
FIG. 8B(1)
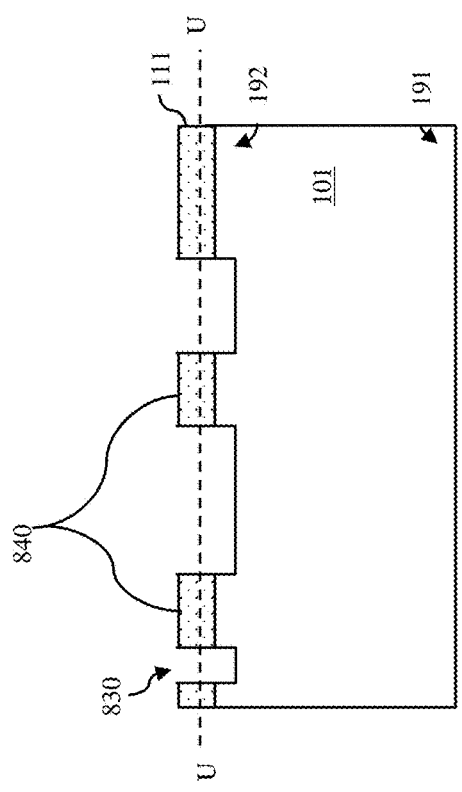
FIG. 8A(2)
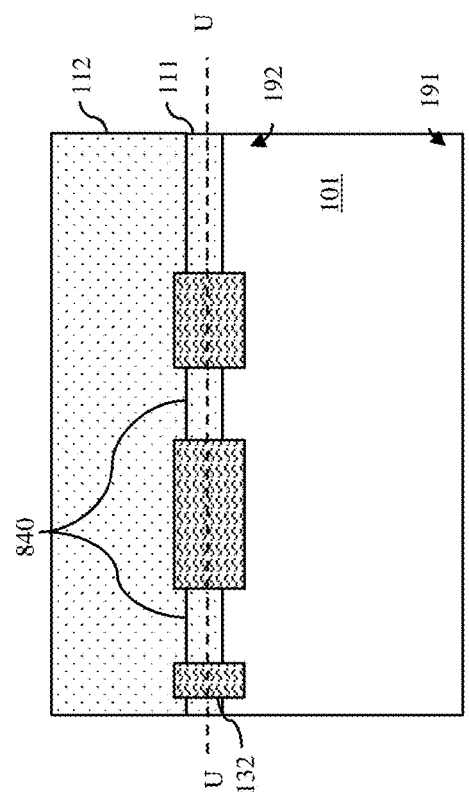
FIG. 8B(2)

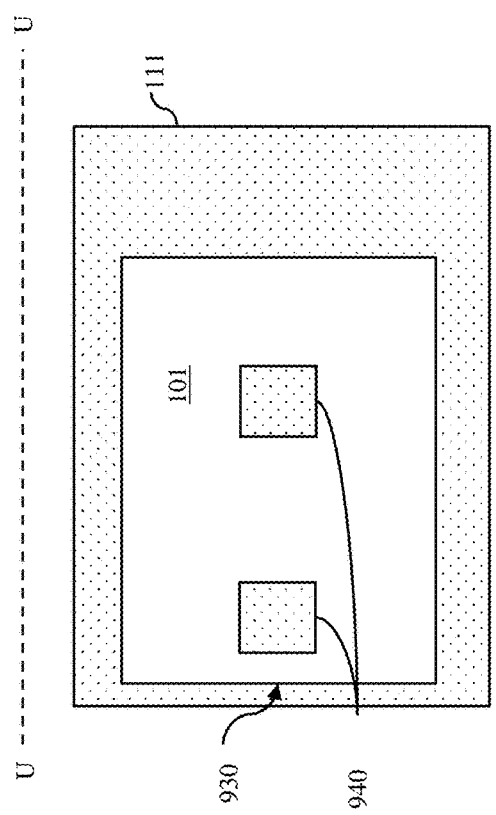
FIG. 9A(2)
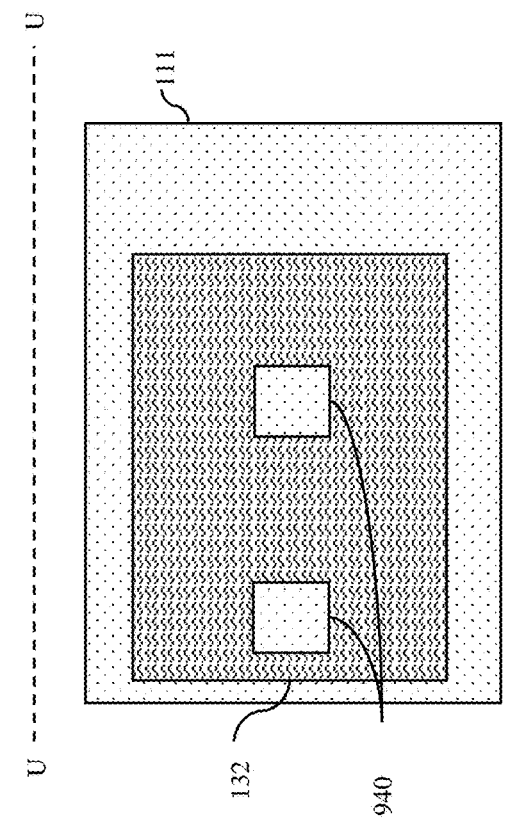
FIG. 9B(2)
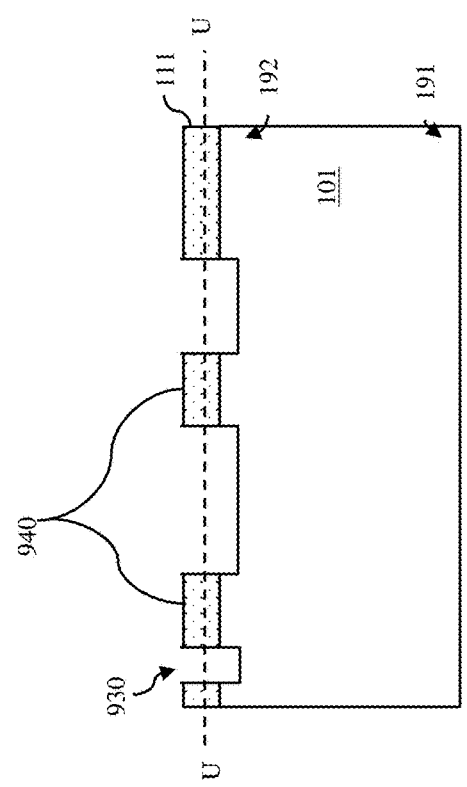
FIG. 9A(1)
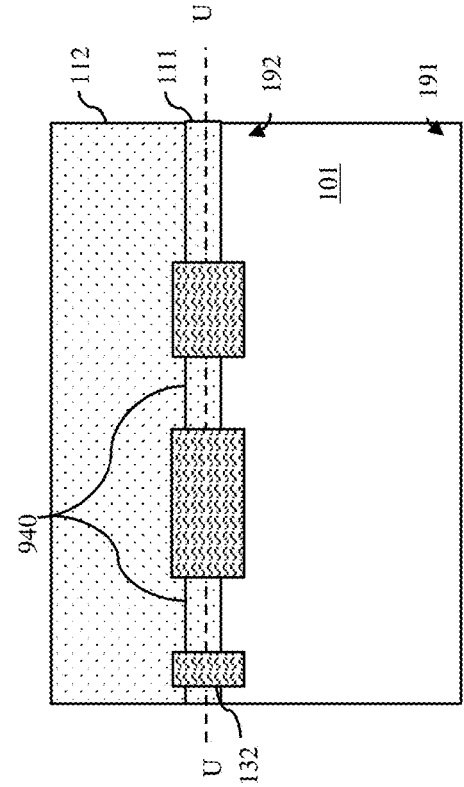
FIG. 9B(1)

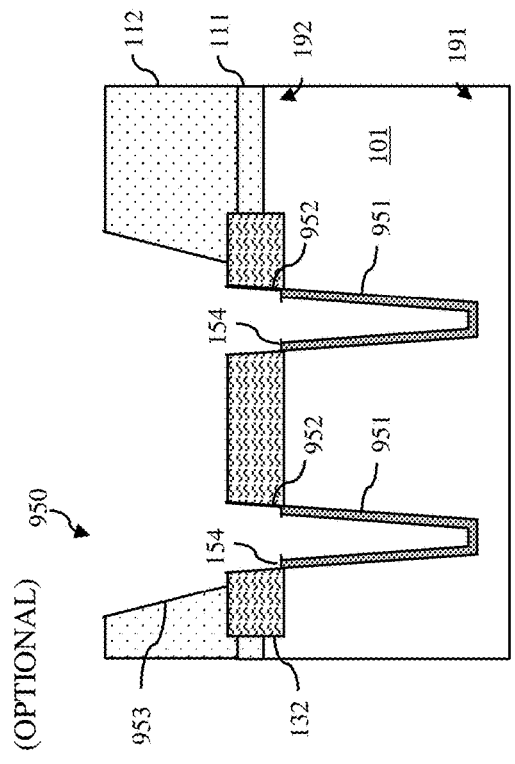
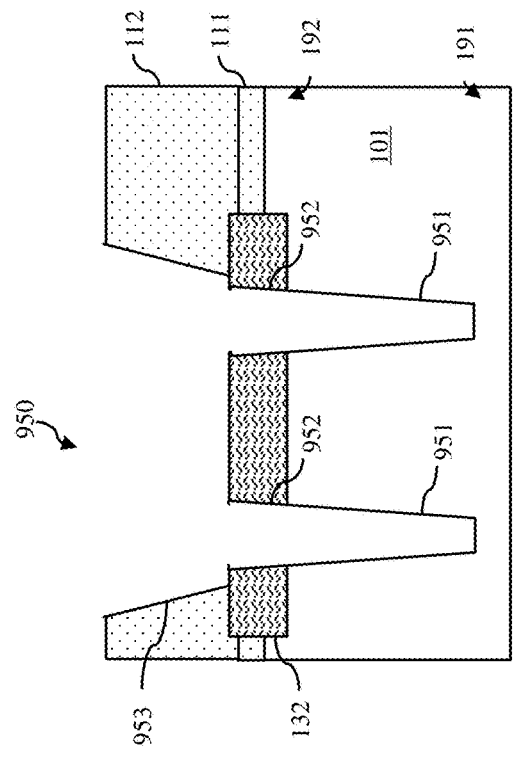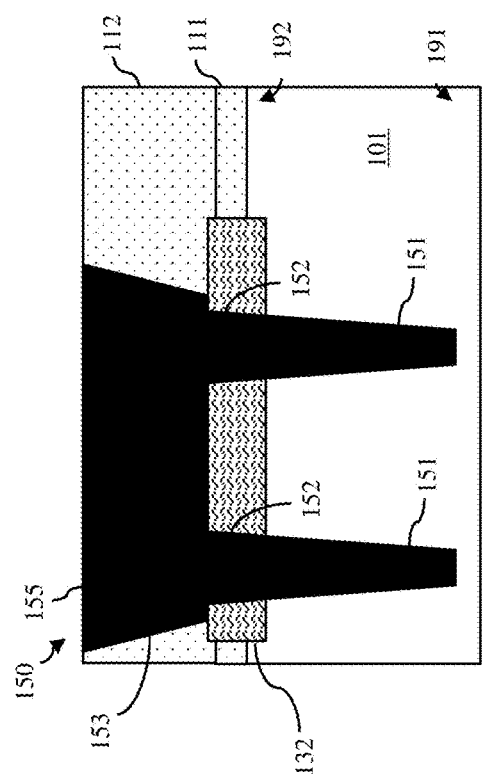

INTEGRATED CIRCUIT STRUCTURE WITH THROUGH-METAL THROUGH-SUBSTRATE INTERCONNECT AND METHOD

BACKGROUND

Field of the Invention

The present invention relates to interconnects and, more particularly, to embodiments of an integrated circuit (IC) structure that includes at least one elongated vertically-oriented interconnect and a method of forming the IC structure.

Description of Related Art

Oftentimes, in an integrated circuit (IC) structure, a device on the front side of a substrate will be electrically connected to a back end of the line (BEOL) metal wire by a middle of the line (MOL) contact. The same BEOL metal wire may also be electrically connected by a through silicon via (TSV) to a metallic feature (e.g., a ground wire) on the back side of the substrate, thereby indirectly connecting the device to the backside metallic feature.

SUMMARY

Disclosed herein are embodiments of an integrated circuit (IC) structure that includes at least one through-metal through-substrate interconnect.

Generally, each of the IC structure embodiments can include a substrate. The substrate can have a first side and a second side opposite the first side. The IC structure can further include a first dielectric layer adjacent to the second side of the substrate and a metallic feature in a metallic feature opening, which extends through the first dielectric layer. The IC structure can further include a second dielectric layer, which the first dielectric layer and further extends over the metallic feature. The IC structure can further include a through-metal through-substrate interconnect. Specifically, this interconnect can include a first portion in the substrate, a second portion that extends up from the first portion through the metallic feature, and a third portion that extends up from the second portion through the second dielectric layer.

Some of the IC structure embodiments can specifically include a multi-layered substrate. The multi-layered substrate can include multiple layers including at least a channel layer and a barrier layer on the channel layer. In any case, the multi-layered can have a first side and a second side opposite the first side. The IC structure can further include a first dielectric layer on the second side of the multi-layered substrate adjacent to the barrier layer. The IC structure can further include a transistor. The transistor can include source/drain openings that extend from a top surface of the first dielectric layer to the channel layer. The transistor can further include metallic source/drain regions in the source/drain openings immediately adjacent to the channel layer. The transistor can further include a gate opening that is positioned laterally between the source/drain openings and that extends from the top surface of the first dielectric layer to the bottom surface of the first dielectric layer. The transistor can further include a gate structure in the gate opening. The IC structure can further include a second dielectric layer on the first dielectric layer and further covering the metallic source/drain regions and the gate structure. The IC structure can further include at least one through-metal through-substrate interconnect. Specifically, each interconnect include a first portion in the multi-layered substrate, a second portion that extends up from the first portion through a corresponding one of the metallic source/drain regions, and a third portion that extends up from the second portion through the second dielectric layer.

Also disclosed herein are method embodiments for forming the above-described IC structure embodiments that include at least one through-metal through-substrate interconnect. Generally, each of the method embodiments can include forming a first dielectric layer on a substrate. The substrate can have a first side and a second side opposite the first side and the first dielectric layer can be formed adjacent to the second side of the substrate. Each of the method embodiments can further include forming a metallic feature opening that extends through the first dielectric layer and forming a metallic feature in the metallic feature opening. Each of the method embodiments can further include forming a second dielectric layer on the first dielectric layer and over the metallic feature. Each of the method embodiments can further include forming one through-metal through-substrate interconnect. The interconnect can specifically be formed so that it includes a first portion in the substrate, a second portion that extends up from the first portion through the metallic feature, and a third portion that extends up from the second portion through the second dielectric layer.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 7A(1)-(2) to 7E are cross-section diagrams illustrating partially completed IC structures formed during process steps 610-615 of process flow A of FIG. 6;

FIGS. 9A(1)-(2) to 9E are cross-section diagrams illustrating partially completed IC structures formed during process steps 630-635 of process flow C of FIG. 6.

DETAILED DESCRIPTION

As mentioned above, oftentimes an integrated circuit (IC) structure will include an elongated vertically-oriented interconnect (often referred to as a through substrate via or a through silicon via (TSV)) that extends through a significant portion of the structure (e.g., from a metallic feature, such as a grounded metal layer, on the backside of a substrate, through the substrate, through a shallow trench isolation (STI) region on the frontside of the substrate, and further through interlayer dielectric (ILD) material to a back end of the line (BEOL) metal wire). The IC structure will also include one or more devices (e.g., one or more transistors and/or other types of devices) on the frontside of the substrate and one or more middle of the line (MOL) contacts that extend essentially vertically through the ILD material between components of the device(s) and BEOL metal wires. At least one of these MOL contacts can electrically connect a component of a device (e.g., a source/drain region of a transistor) to the same metal wire that is in contact with the elongated interconnect (e.g., to connect the component of the device indirectly electrically to a metallic feature on the backside of the substrate).

In view of the foregoing, disclosed herein are embodiments of an integrated circuit (IC) structure that includes a through-metal through-substrate interconnect. The interconnect can be vertically-oriented, extending through a device level metallic feature on a frontside of a substrate, extending downward from the device level metallic feature into or completely through the substrate (e.g., to contact a backside metallic feature below), and further extending upward from the device level metallic feature through interlayer dielectric (ILD) material (e.g., to contact a BEOL metallic feature above). The device level metallic feature can be, for example, a metallic source/drain region of a transistor, such as a high electron mobility transistor (HEMT) or a metal-insulator-semiconductor high electron mobility transistor (MISHEMT), which is formed on the frontside of the substrate. The backside metallic feature can be, for example, a grounded metal layer. The BEOL metallic feature can be, for example, a metal wire in one of the BEOL metal levels above the device level. By employing a single essentially vertically-oriented through-metal through-substrate interconnect to electrically connect a device level metallic feature to additional features below and above, electrical loss related to unwanted resistance and inductance can be minimized. Also disclosed herein are embodiments of a method of forming such an IC structure.

Figure 1B:
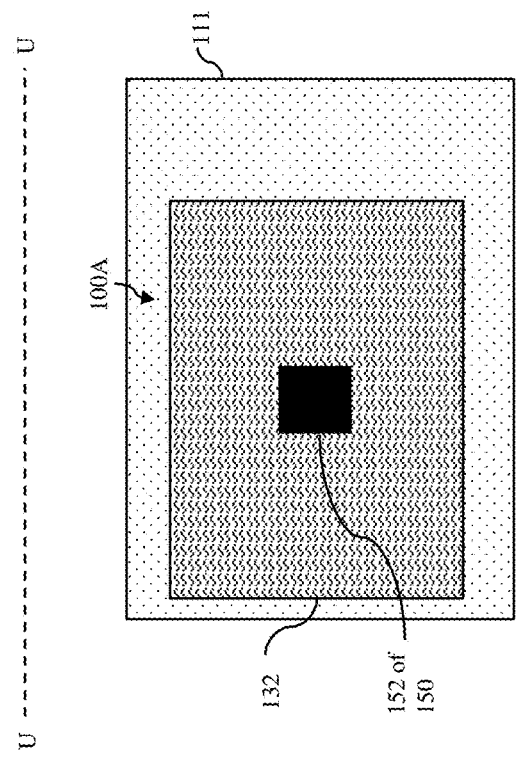
FIGS. 1A and 1B-1C are a vertical cross-section diagram and two different horizontal cross-section diagrams, respectively, illustrating an embodiment of an integrated circuit (IC) structure 100A.
Figure 1C:
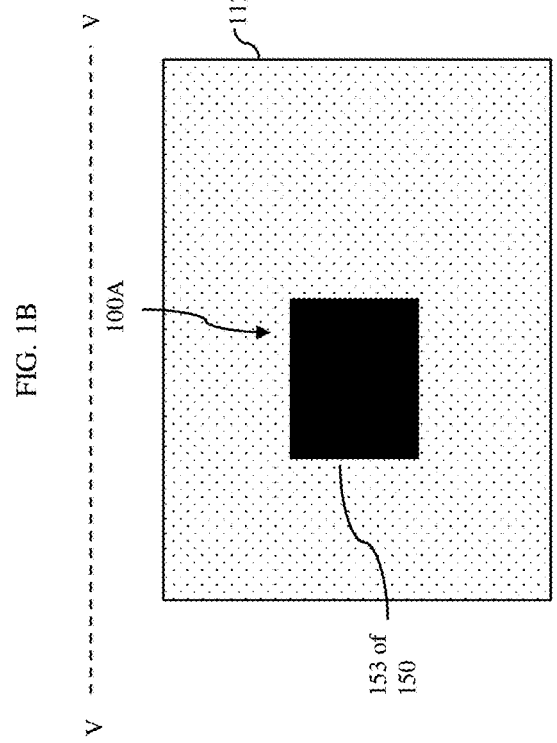
Figure 1A:
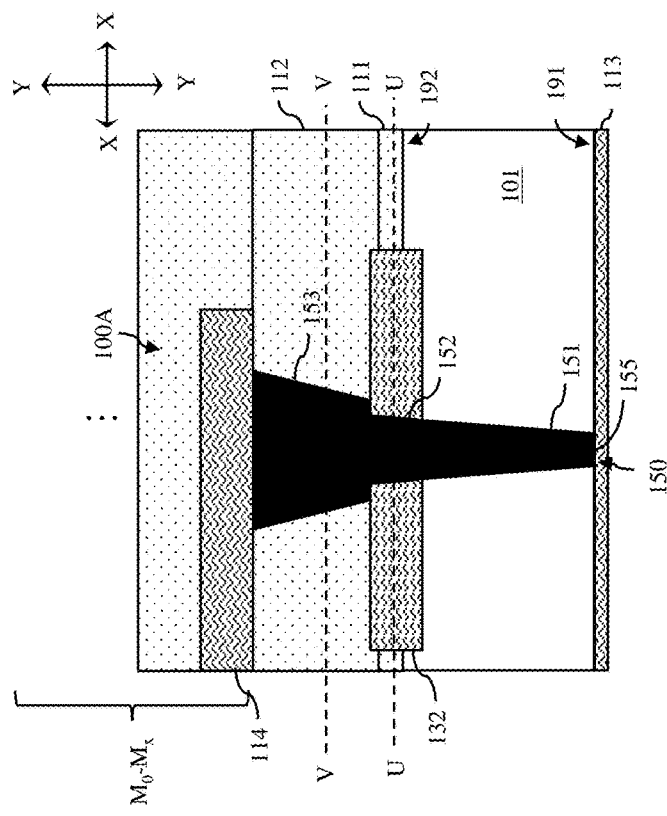
Figure 2B:
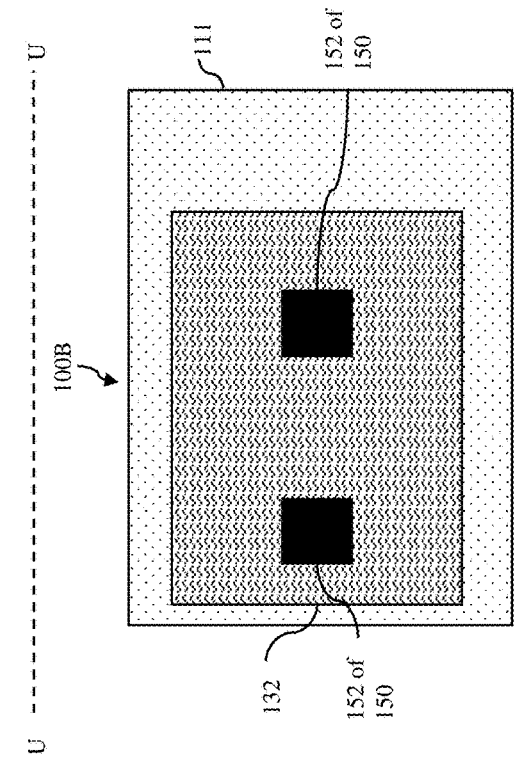
FIGS. 2A and 2B-2C are a vertical cross-section diagram and two different horizontal cross-section diagrams, respectively, illustrating an embodiment of an IC structure 100B.
Figure 2C:
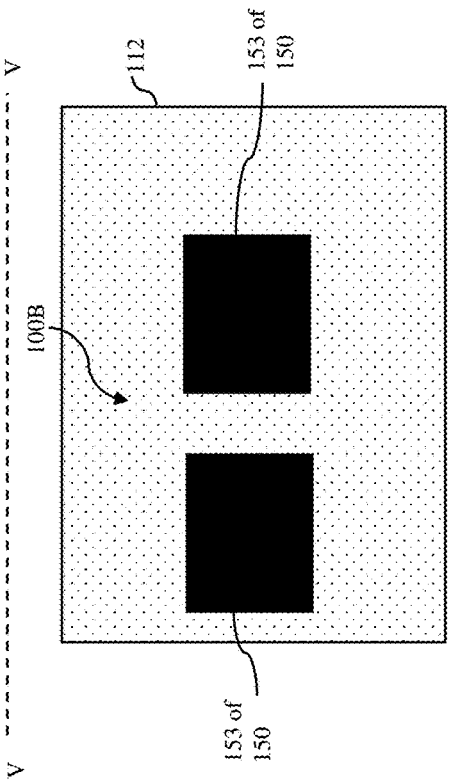
Figure 2A:
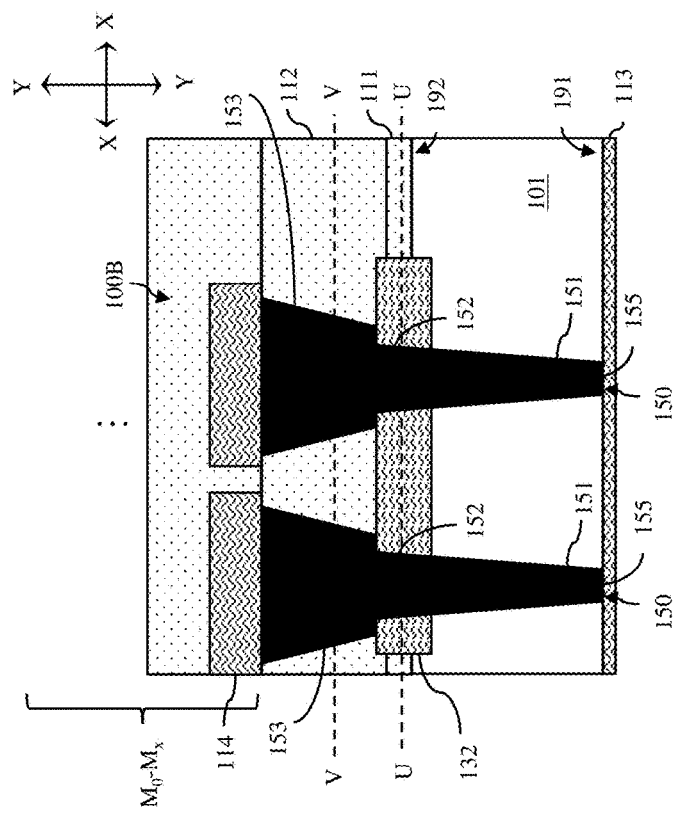
Figure 3B:
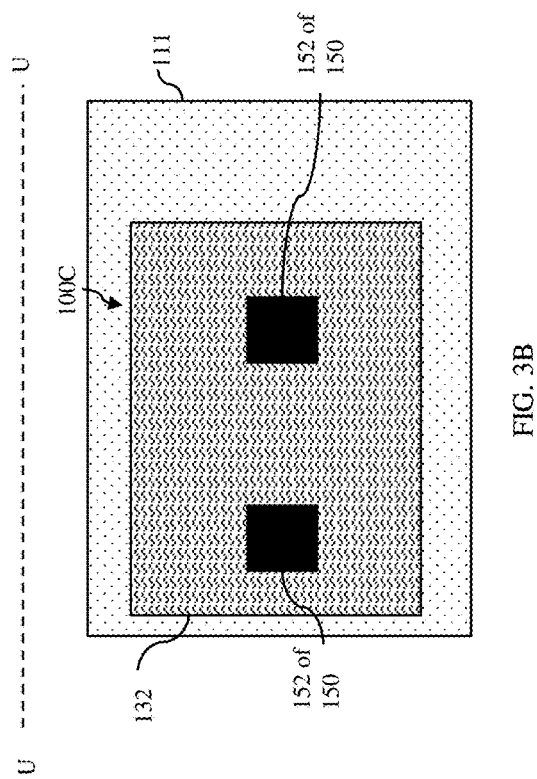
FIGS. 3A and 3B-3C are a vertical cross-section diagram and two different horizontal cross-section diagrams, respectively, illustrating an embodiment of an IC structure 100C.
Figure 3C:
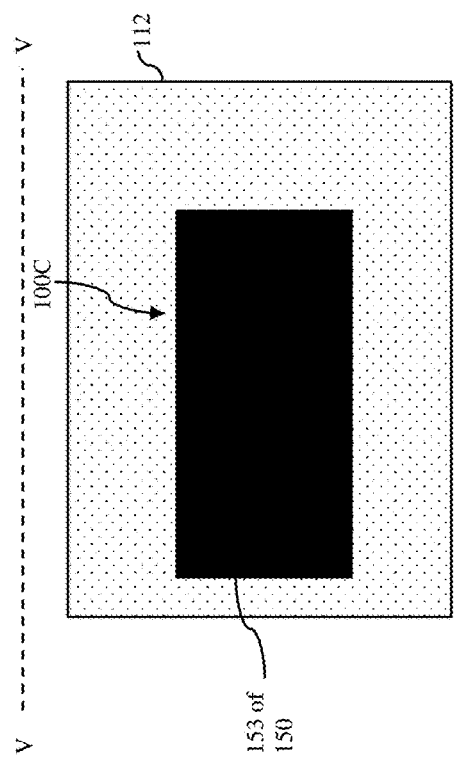
Figure 3A:
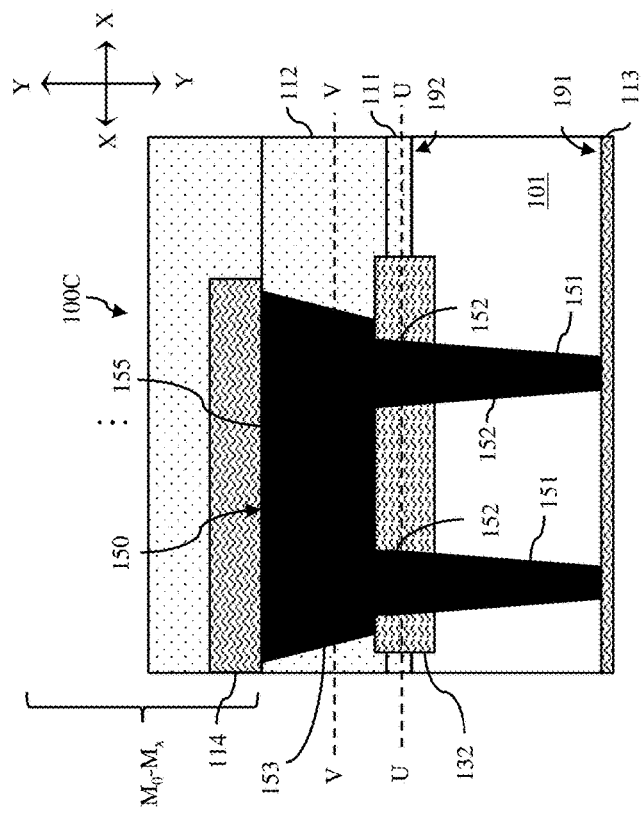

FIGS. 1A and 1B-1C are a vertical cross-section diagram and two different horizontal cross-section diagrams, respectively, illustrating an embodiment of an integrated circuit (IC) structure 100A. FIGS. 2A and 2B-2C are a vertical cross-section diagram and two different horizontal cross-section diagrams, respectively, illustrating an embodiment of an IC structure 100B. FIGS. 3A and 3B-3C are a vertical cross-section diagram and two different horizontal cross-section diagrams, respectively, illustrating an embodiment of an IC structure 100C.

Referring to FIGS. 1A-1C, 2A-2C, and 3A-3C, in each of the disclosed IC structure embodiments 100A-100C can include a substrate 101. The substrate 101 could be a single-layered substrate such as a bulk semiconductor substrate (e.g., a bulk silicon substrate). Alternatively, the substrate 101 could be a multi-layered substrate such as a semiconductor-on-insulator substrate (e.g., a silicon-on-insulator substrate) that includes an initial substrate layer (e.g., a silicon or other initial substrate layer), an insulator layer (e.g., an oxide layer or other insulator layer) on the initial substrate layer, and a semiconductor layer (e.g., a silicon layer) on the insulator layer. Alternatively, the substrate 101 could be some other type of multi-layered substrate such as a substrate that includes multiple different epitaxial semiconductor layers that are required for a high electron mobility transistor (HEMT) or a metal-insulator-semiconductor high electron mobility transistor (MISHEMT) formation, as discussed in greater detail below with respect to the more specific IC structure embodiments 500A-500C shown FIGS. 5A-5C. In any case, the substrate 101 can have a first side 191 (also referred to herein as a backside or bottom surface) and a second side 192 (also referred to herein as a frontside or top surface), which is opposite the first side 191.

Each of the IC structure embodiments 100A-100C can further include a first dielectric layer 111 adjacent to the second side 192 of the substrate 101. The first dielectric layer 111 can include one or more relatively thin layers (thin films) of dielectric material (e.g., silicon dioxide, silicon nitride, etc.).

Each of the IC structure embodiments 100A-100C can further include a metallic feature 132, which is embedded in the first dielectric layer 111. Specifically, a metallic feature opening can extend through the first dielectric layer 111 to the second side 192 of the substrate 101 and, optionally, can extend to some depth within the substrate 101 (as illustrated). For example, in embodiments where the substrate 101 is a multi-layered substrate the metallic feature opening can extend into and through one or more of the layers of the substrate 101. In any case, the metallic feature 132 can be formed within (e.g., deposited into) the metallic feature opening adjacent to the second side 192 of the substrate 101. Thus, the size and shape of the metallic feature opening defines the size and shape of the metallic feature 132 itself. The metallic feature 132 can be a relatively flat, metallic pad or plate within the metallic feature opening. Thus, the metallic feature 132 can be an essentially horizontally-oriented metallic feature. For purposes of this disclosure, an "essentially horizontally-oriented" feature refers to a feature that is oriented essentially parallel to the first side 191 of the substrate 101 in the XX direction, as indicated, plus or minus up to 30 degrees. Depending upon the process techniques used to form the metallic feature 132 and/or used during downstream processing the top surface of the metallic feature 132 may be at a level above the top surface of the top surface of the first dielectric layer 111 (as shown), may be co-planar with the top surface of the first dielectric layer 111 (not shown) or may be below the top surface of the first dielectric layer 111 (not shown). Optionally, instead of being a relatively flat metallic pad or plate, the metallic feature 132 could be essentially T-shaped with a narrow portion within the metallic feature opening and a wider portion above and extending laterally onto the first dielectric layer 111 at the edge of the metallic feature opening (not shown). In any case, the metallic feature 132 can be made up of a single metal or metal alloy layer or multiple metal or metal alloy layers. In some embodiments, the metallic feature 132 can be an ohmic contact made of, for example, Ti/Al/TIN, Ti/Al/Ti/Au or Mo/Al/Mo/Au.

Each of the IC structure embodiments 100A-100C can further include a second dielectric layer 112 covering the metallic feature 132 and the first dielectric layer 111. The second dielectric layer 112 can include one or more layers interlayer dielectric material (e.g., silicon dioxide, silicon nitride, etc.). The top surface of the second dielectric layer 112 can be planarized such that it is essentially parallel to the first side 191 of the substrate 101.

Each of the IC structure embodiments 100A-100C can further include at least one essentially vertically-oriented interconnect 150 (also referred to herein as a through-metal through-substrate interconnect). For purposes of this disclosure, an "essentially vertically-oriented" feature refers to a feature that, in total, is oriented essentially perpendicular to the first side 191 of the substrate 101 in the YY direction, as indicated, plus or minus up to 30 degrees. In any case, each interconnect 150 can include at least: a first portion 151, which is in the substrate 101; a second portion 152, which extends from the first portion 151 through the metallic feature 132; and a third portion 153, which extends from the second portion 152 through the second dielectric layer 112 such that the interconnect 150, as a whole, is essentially vertically-oriented relative to the first side 191 of the substrate 101.

For example, as shown in FIGS. 1A-1C, the IC structure embodiment 100A can include a single interconnect 150 extending through the metallic feature 132. Specifically, in the IC structure embodiment 100A, a single interconnect opening can include: a lower portion that extends from the bottom of the metallic feature 132 partially through (not shown) or completely through the substrate 101 (as illustrated); a middle portion that extends through the metallic feature 132 to the lower portion; and an upper portion that extends from the top of the second dielectric layer 112 down to the metallic feature 132 such that it is aligned with the middle portion. The interconnect 150 can be within the interconnect opening and can include: a single first portion 151, which is within the lower portion of the interconnect opening within the substrate 101; a single second portion 152, which fills the middle portion of the interconnect opening such that it extends from immediately adjacent to the first portion 151 up through the metallic feature 132; and a single third portion 153, which fills the upper portion of the interconnect opening on top of the metallic feature 132 such that it is immediately adjacent to the second portion 152 and extends from the second portion 152 up to the top of the second dielectric layer 112.

Alternatively, as shown in FIGS. 2A-2C, the IC structure embodiment 100B can include multiple interconnects 150 (i.e., an interconnect and one or more additional interconnects) extending through the metallic feature 132. Specifically, the IC structure embodiment 100B can include multiple interconnect openings. Each interconnect opening can include: a lower portion that extends from the bottom of the metallic feature 132 partially through (not shown) or completely through the substrate 101 (as illustrated); a middle portion that extends through the metallic feature 132 to the lower portion; and an upper portion that extends from the top of the second dielectric layer 112 down to the metallic feature 132 such that it is aligned with the middle portion. Each interconnect 150 can be within a corresponding interconnect opening and can include: a single first portion 151, which is within the lower portion of the interconnect opening within the substrate 101; a single second portion 152, which fills the middle portion of the interconnect opening such that it extends from immediately adjacent to the first portion 151 up through the metallic feature 132; and a single third portion 153, which fills the upper portion of the interconnect opening on top of the metallic feature 132 such that it is immediately adjacent to the second portion 152 and extends from the second portion 152 up to the top of the second dielectric layer 112. Each interconnect opening and interconnect contained therein can be physically separated from any adjacent interconnect openings and adjacent interconnects contained therein.

Alternatively, as shown in FIGS. 3A-3C, the IC structure embodiment 100C can include an interconnect 150 with multiple portions of the interconnect extending through the metallic feature 132. Specifically, the IC structure embodiment 100C can include an interconnect opening. The interconnect opening can include: multiple lower portions that extend from the bottom of the metallic feature 132 partially into (not shown) or completely through the substrate 101 (as illustrated); multiple middle portion that extend through the metallic feature 132 to the lower portions, respectively; and an upper portion that extends from the top of the second dielectric layer 112 down to the metallic feature 132 such that it is aligned above each of the middle portions. The interconnect 150 can be within the interconnect opening and can include: multiple first portions 151, which are within the lower portions of the interconnect opening within the substrate 101; multiple second portions 152, which fill the middle portions of the interconnect opening such that the extends from immediately adjacent to corresponding first portions 151 up through the metallic feature 132; and a single third portion 153, which fills the upper portion of the interconnect opening on top of the metallic feature 132 such that it is immediately adjacent to each of the second portions 152 and extends from the second portions 152 up to the top of the second dielectric layer 112.

Optionally, in each of the IC structure embodiments 100A-100C, the third portion 153 of each interconnect 150 can be wider than any second portion 152 of the same interconnect. Furthermore, the width of any second portion 152 of each interconnect can be approximately the same as the width of the first portion 151 below, as illustrated. However, as discussed in greater detail below with regard to the method, following formation of any middle portion of an interconnect opening through the metallic feature 132 and etch process that is essentially directional and selective to the substrate material will be performed. Depending upon the etch specifications used, the first portion may be slightly wider or narrower than the second portion, the first portion may have tapered sidewalls, etc.

For purposes of illustration, in the IC structure embodiment 100B of FIGS. 2A-2C, only two interconnects 150 are shown extending through the metallic feature 132 into the substrate 101. It should, however, be understood that the figures are not intended to be limiting. Alternatively, more than two (e.g., 5, 10, etc.) interconnects 150 could extend through the metallic feature 132 into the substrate 101 in the IC structure embodiment 100B. Similarly, for purposes of illustration, in the IC structure embodiment 100C in FIGS. 3A-3C only two interconnect portions are shown as extending through the metallic feature 132 into the substrate. Again, it should, however, be understood that the figures are not intended to be limiting. Alternatively, more than two (e.g., 5, 10, etc.) interconnect portions could extend through the metallic feature 132 into the substrate 101 in the IC structure embodiment 100C. The number of interconnects (or interconnect portions) extending through the metallic feature 132 and into the substrate 101 can vary depending upon the need for reduced resistance (e.g., a quick connection to ground), the horizontal cross-sectional area of the metallic feature 132, the horizontal cross-sectional area of the interconnect opening portions extending through the metallic feature 132 and into the substrate, and the spacing needed between adjacent interconnect opening portions extending through the metallic feature 132 to maintain robustness. For example, in some embodiments, the specifications can include: a metallic feature 132 having a square or round shape with a width of 30-100 microns; each interconnect opening portions that extends through the metallic feature 132 into the substrate having a square or round shape with a width of 3-10 microns; and adjacent interconnect opening portions that extend through the metallic feature 132 into the substrate being spaced apart by at least 8 microns to maintain robustness. The maximum allowable number of interconnect portion openings extending through the metallic feature 132 and into the substrate 101 could be calculated given such specifications.

In any case, in each of the IC structure embodiments 100A-100C, each interconnect 150 can include optional adhesive and/or barrier layers that line the corresponding interconnect opening and at least one conductive fill material, such as a metal or metal alloy fill material, that fills the remaining space within the interconnect opening. The adhesion and/or barrier layers can include, for example, a titanium layer, a tantalum layer, a multi-layered structure including layers of tantalum nitride and tantalum, or any other single or multi-layered structure suitable for adhering the fill material to the structure and/or for preventing electromigration of metal ions into the substrate. The conductive fill material could be, for example, tungsten, aluminum, copper, gold, cobalt, nickel or any other conductive fill material typically used to fill a TSV.

Figure 4:
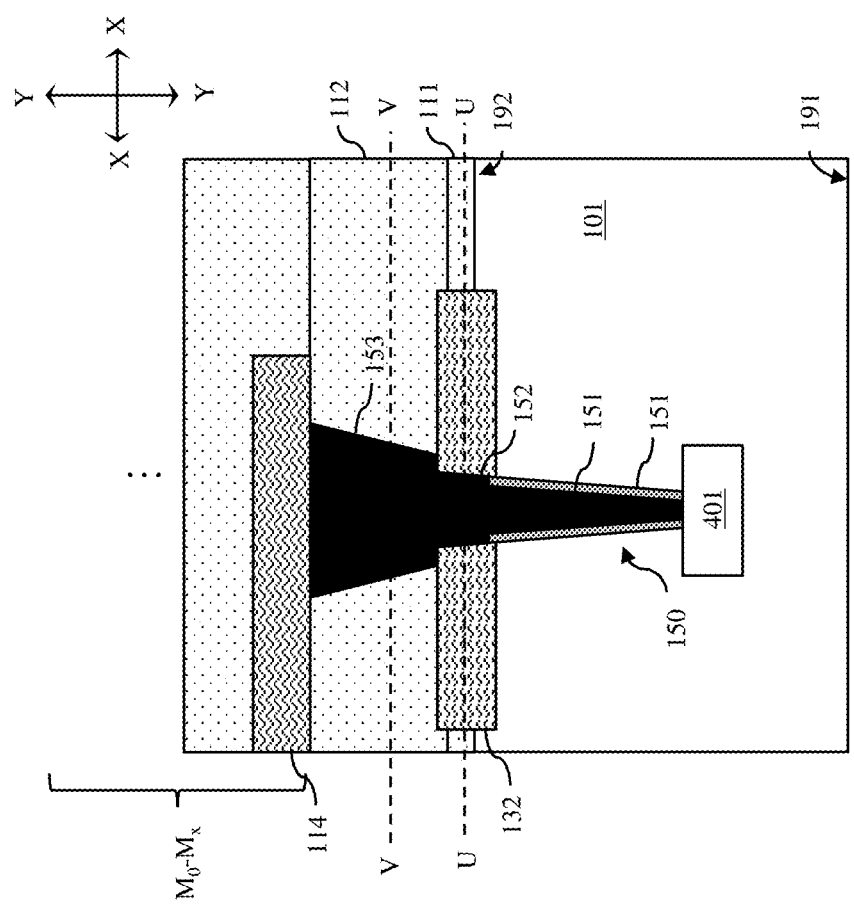
FIG. 4 is a cross-section diagram illustrating optional features that could be incorporated into any of the disclosed IC structure embodiments.

While not shown in the IC structure embodiments 100A-100C, optionally, the first portion(s) 151 of each interconnect 150 can be electrically isolated from the substrate 101 by an insulator layer. For example, as illustrated in FIG. 4, optionally, the lower portion(s) of each interconnect opening can have sidewalls in the substrate 101 and these sidewalls can be lined with an insulator layer 154 (e.g., a conformal silicon dioxide layer, a conformal silicon nitride layer, or some other suitable conformal insulator layer) such that the conductive material of the interconnect 150 is physically separated from and, more particularly, electrically isolated from the substrate 101 by the insulator layer. In any case, as illustrated in FIGS. 1A, 2A, and 3A, in each of the IC structure embodiments 100A-100C, the second portion(s) 152 of each interconnect 150 can be electrically connected to the metallic feature 132. Specifically, the middle portion (s) of each interconnect opening can have sidewalls in the metallic feature 132 and conductive material of the interconnect 150 can be immediately adjacent to those sidewalls such that each interconnect 150 is in contact with and, more particularly, electrically connected to the metallic feature 132.

As mentioned above, in each of the IC structure embodiments 100A-100C, the first portion(s) 151 of each interconnect can extend completely through the substrate 101 (i.e., the first portion(s) 151 can extend from the first side 191 of the substrate 101 to the metallic feature 132 on the second side 192 of the substrate 101), as illustrated. Optionally, each of the IC structure embodiments 100A-100C can also include one or more additional metallic features in contact with the interconnect 150 One such additional metallic feature 113 can be on the first side 191 of the substrate 101 immediately adjacent to the bottom 155 of each first portion 151 of each interconnect 150. The additional metallic feature 113 on the first side 191 of the substrate 101 can be, for example, a grounded metallic layer (i.e., a grounded metal or metal alloy layer), such as a grounded copper or gold film, or some other backside metallic feature requiring an electrical connection to the metallic feature 132. Additionally, or alternatively, an additional metallic feature 114 can be on the second dielectric layer 112 immediately adjacent to the third portion 153 of an interconnect 150. The additional metallic feature 114 can be, for example, a back end of the line (BEOL) metal wire or via in a lowest metal level (MO) of the BEOL metal levels ($M_0$-$M_x$).

As mentioned above, although not shown in FIG. 1A-1C, 2A-2C or 3A-3C, in each of the IC structure embodiments 100A-100C, the first portion(s) 151 of each interconnect 150 can, optionally, extend only partially through the substrate 101. That is, in some IC embodiments, the first portion(s) 151 of each interconnect 150 may have a bottom that is at some depth within the substrate 101 between the first side 191 and the second side 192 (e.g., see the exemplary IC structure shown in FIG. 4 wherein the bottom of the first portion 151 of an interconnect 150 is at some level between the first and second sides 191-192). As illustrated in FIG. 4, such an IC structure embodiment can also include one or more additional metallic or non-metallic features in contact with the interconnect 150. A device 401 (e.g., a capacitor, resistor, etc.) can be embedded within the substrate 101 immediately adjacent to the first portion(s) 151 of each interconnect 150. Additionally, or alternatively, an additional metallic feature 114 (e.g., a BEOL metal wire or via) can be on the second dielectric layer 112 immediately adjacent to the third portion 153 of an interconnect 150.

In some IC structure embodiments disclosed herein, a metallic feature that is embedded in a first dielectric layer and that has a through-metal through-substrate interconnect extending therethrough can be a metallic source/drain region of a transistor (e.g., a high electron mobility transistor (HEMT) or a metal-insulator-semiconductor high electron mobility transistor (MISHEMT)).

Figure 5A:
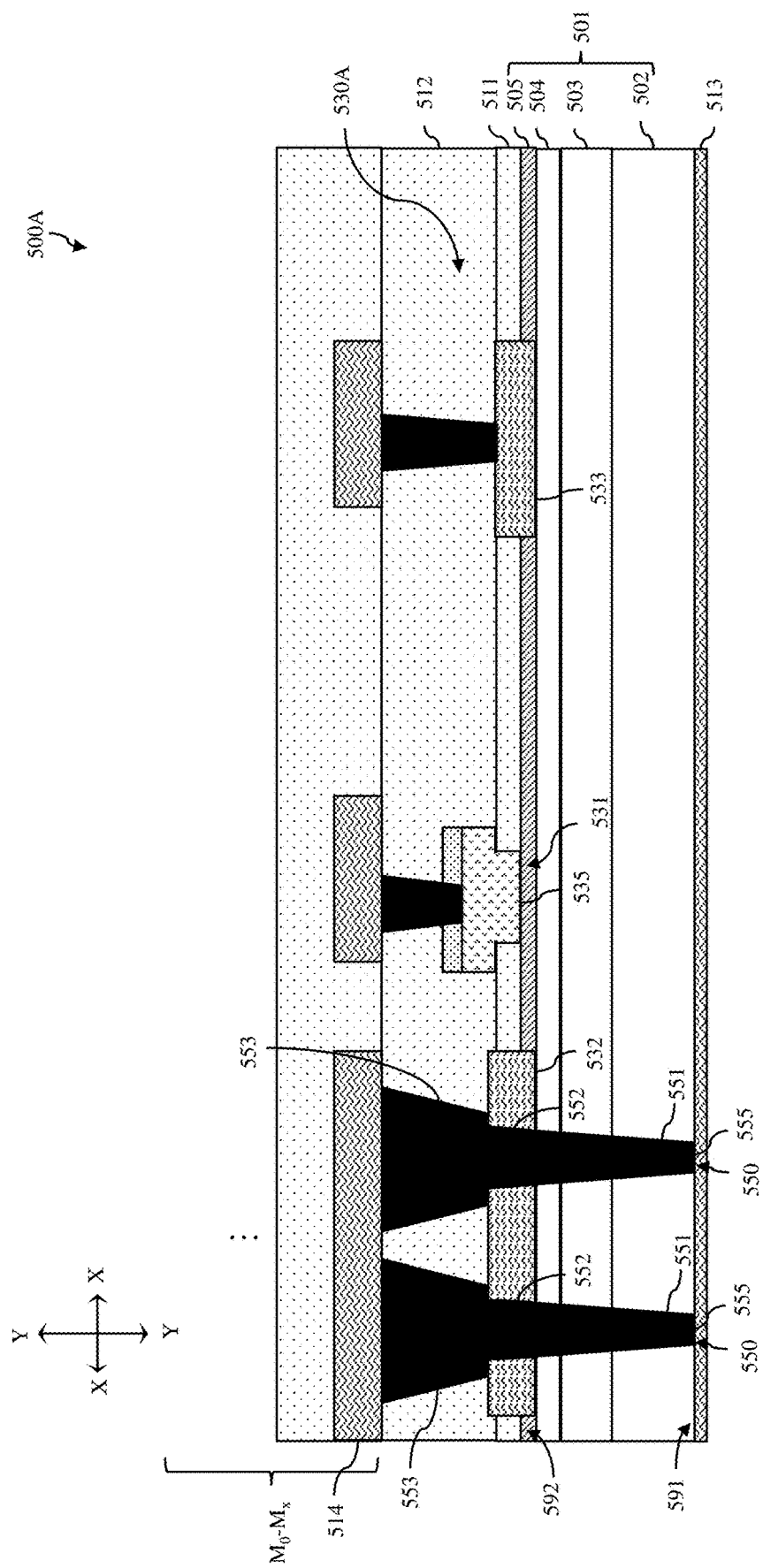
FIG. 5A is cross-section diagram illustrating an IC structure embodiment including a high electron mobility transistor (HEMT) with a metallic source/drain region having one or more through-metal through-substrate interconnects extending therethrough.
Figure 5B:
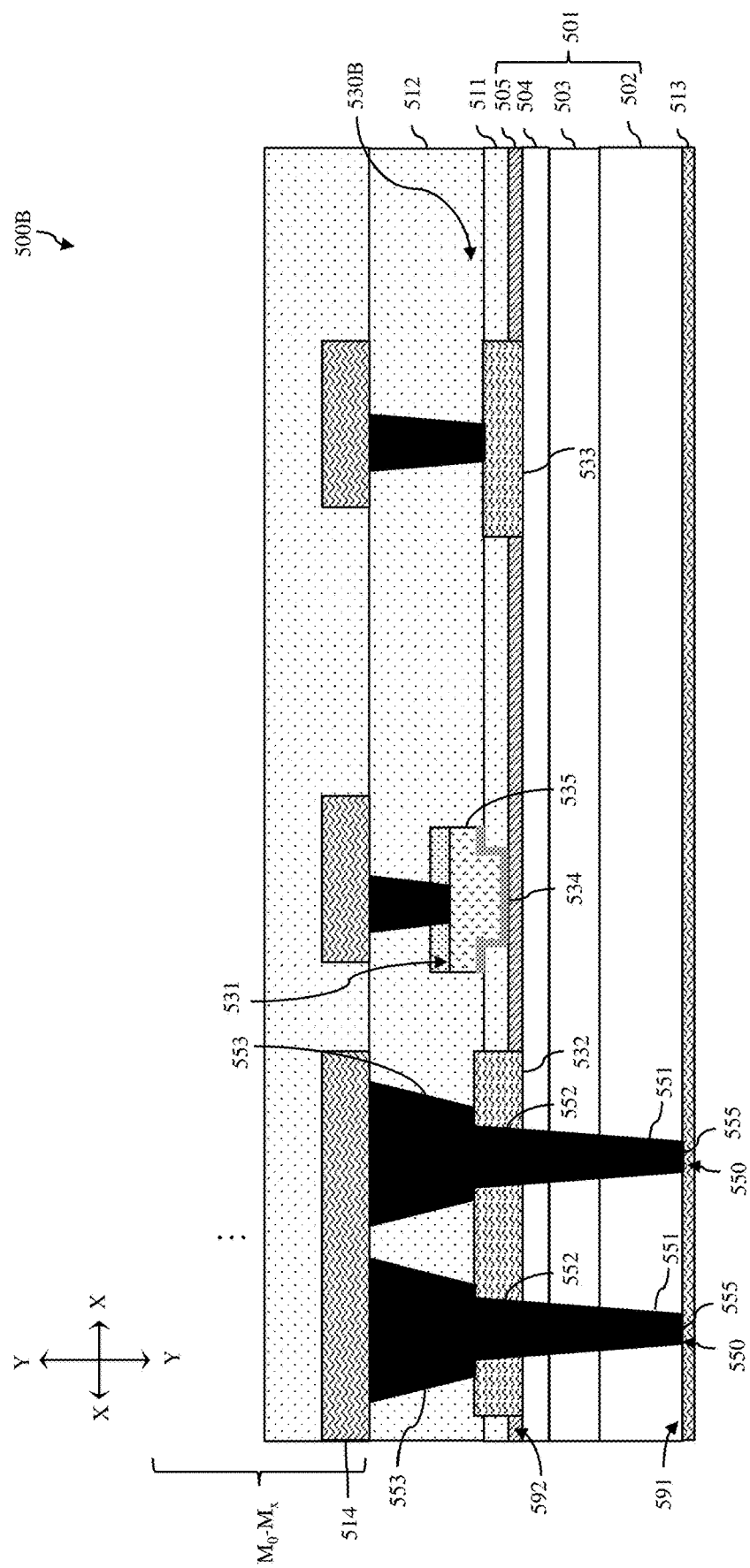
FIG. 5B is cross-section diagram illustrating an IC structure embodiment including a metal-insulator-semiconductor high electron mobility transistor (MISHEMT) with a metallic source/drain region having one or more through-metal through-substrate interconnects extending therethrough.
Figure 5C:
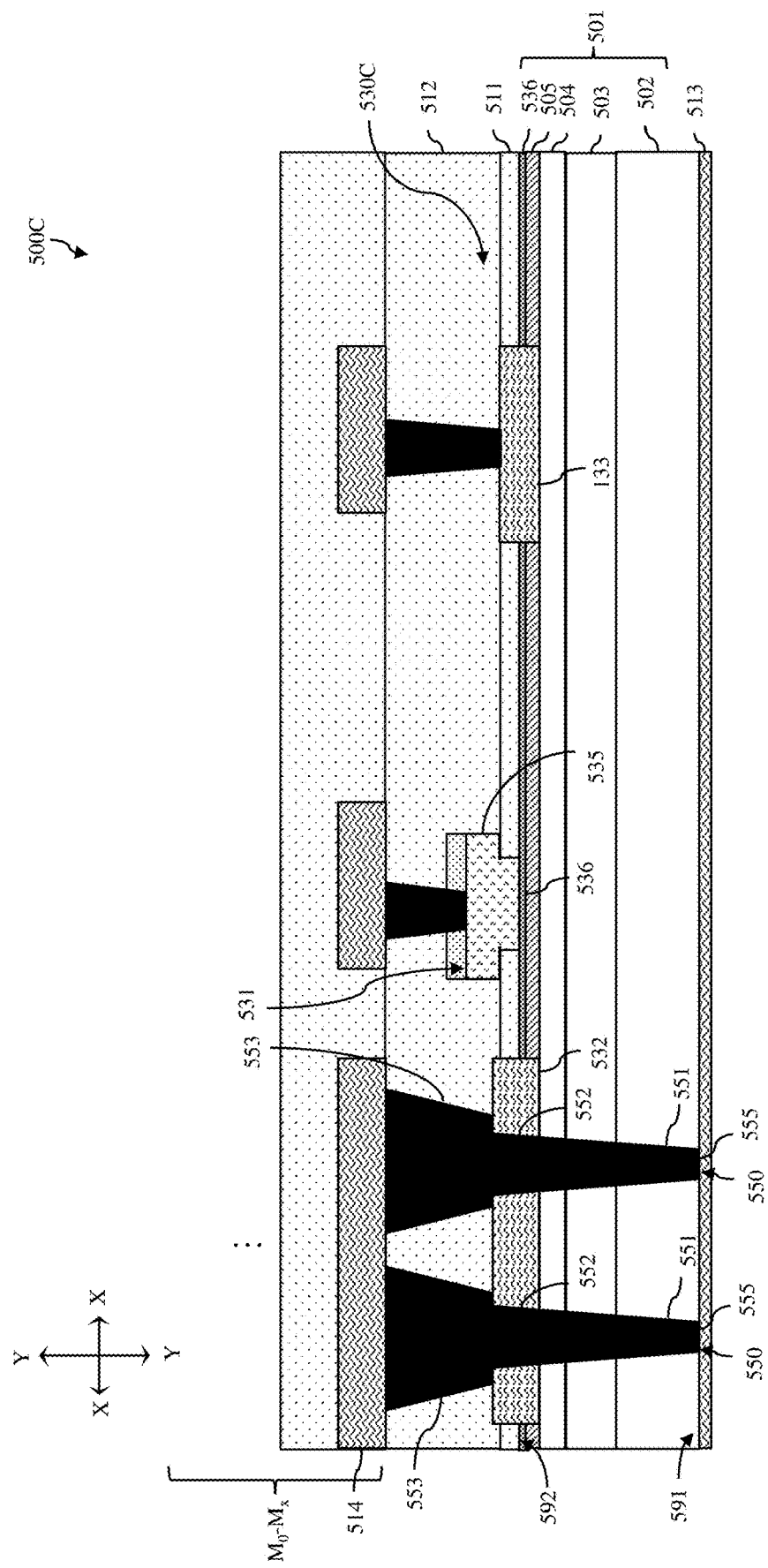
FIG. 5C is cross-section diagram illustrating another IC structure embodiment including a metal-insulator-semiconductor high electron mobility transistor (MISHEMT) with a metallic source/drain region having one or more through-metal through-substrate interconnects extending therethrough.

For example, FIG. 5A is cross-section diagram illustrating an IC structure embodiment 500A that includes a HEMT 530A with a metallic source/drain region 532 having one or more through-metal through-substrate interconnects 550 extending therethrough. FIG. 5B is cross-section diagram illustrating an IC structure embodiment 500B that includes a MISHEMT #1 530B with a metallic source/drain region 532 having one or more through-metal through-substrate interconnects 550 extending therethrough. FIG. 5C is cross-section diagram illustrating yet another IC structure embodiment 500C that includes a different MISHEMT #2 530C with a metallic source/drain region 532 having one or more through-metal through-substrate interconnects 550 extending therethrough. For purposes of illustration, each of the IC structure embodiments 500A-500C shown in FIGS. 5A-5C include multiple through-metal through-substrate interconnects 550 that extend through the same metallic source/drain region 532 in essentially the same manner as described above and illustrated in FIGS. 2A-2C. However, it should be understood that, alternatively, any of the other through-metal through-substrate interconnect configurations (as discussed above and illustrated in FIG. 1A-1C, 3A-3C or 4) could be employed in the IC structure embodiments 500A-500C.

In any case, each of the IC structure embodiments 500A-500C can include a substrate 501 having a first side 591 (also referred to herein as a backside or a bottom surface) and a second side 592 (also referred to herein as a frontside or a top surface), which is opposite the first side 591. This substrate 501 can specifically be a multi-layered substrate. The multi-layered substrate 501 can include an initial substrate layer 502. This initial substrate layer can be, for example, a silicon or silicon-based substrate (e.g., a silicon carbide (SiC) substrate), a sapphire substrate, a III-V semiconductor substrate (e.g., a gallium nitride (GaN) substrate or some other suitable III-V semiconductor substrate) or any other suitable substrate for a III-V semiconductor device.

The multi-layered substrate 501 can further include a stack of additional layers on the initial substrate layer 502. The stack of additional layers can include multiple epitaxially grown layers. The epitaxially grown layers can include a buffer layer 503, which is epitaxially grown on the top surface of the initial substrate layer 502. Such a buffer layer 503 can be employed as an anchor to achieve nucleation and to duplicate orientation in subsequently grown epitaxial layers. This buffer layer 503 can be doped or undoped. Optionally, the buffer layer 503 can be carbon-doped. The epitaxially grown layers can also include a channel layer 504 and, more particularly, a III-V semiconductor channel layer, which is epitaxially grown on the top surface of the buffer layer 503 and which will be employed as the device channel layer. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). It should be noted that the buffer layer 503 can also be employed to allow the channel layer 504 to be grown and to provide for lattice constants of the initial substrate layer 502 below and the channel layer 504 above. The epitaxially grown layers can further include a barrier layer 505, which is epitaxially grown on the top surface of the III-V semiconductor channel layer 504. The barrier layer 505 can have a band gap that is wider than the bandgap of the III-V semiconductor channel layer 504 for the device channel. Those skilled in the art will recognize that the barrier and channel materials can be selected so that a heterojunction is formed at the interface between the two layers, thereby resulting in the formation of a two-dimensional electron gas (2DEG) in the channel layer 504. This 2DEG in the channel layer 504 can provide the conductive pathway for the drifting of charges between the source and the drain.

In some embodiments, the buffer layer 503 could be, for example, a gallium nitride (GaN) buffer layer, an aluminum nitride (AlN) buffer layer, or a buffer layer of any other material suitable for use as a buffer layer of a HEMT, a MISHEMT #1 or a MISHEMT #2. The III-V semiconductor channel layer 504 could be, for example, a gallium nitride (GaN) layer or a III-V semiconductor channel layer made of any other suitable III-V semiconductor compound suitable for use as a channel layer in such a transistor. Furthermore, the barrier layer 505 could be, for example, an aluminum gallium nitride (AlGaN) barrier layer, aluminum nitride (AlN) barrier layer or a barrier layer of any other material suitable for use as a barrier layer in such a transistor.

For purposes of illustration, the figures and the description above depict the epitaxially grown layers in the stack (e.g., the buffer layer 503, the channel layer 504 and the barrier layer 505) as being single layered structures (i.e., comprising one layer of buffer material, one layer of channel material and one layer of barrier material). However, it should be understood that, alternatively, any one or more of the epitaxially grown layers in the stack could be multi-layered structures (e.g., comprising multiple sub-layers of different buffer materials, multiple sub-layers of different III-V semiconductor channel materials and/or multiple sub-layers of different barrier materials).

It should be noted that, for the MISHEMT #2 530C shown in FIG. 5C, the multi-layered substrate can also include gate dielectric layer 536 on the top surface of the barrier layer 505. This gate dielectric layer 536 can be, for example, a silicon dioxide (SiO$_2$) layer, a high K dielectric layer or a layer of any other dielectric material suitable for use as a gate dielectric layer of a MISHEMT. Exemplary high-K dielectric materials that could be employed include, but are not limited to, a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.).

In any case, each of IC structure embodiments 500A-500C can further include a first dielectric layer 511. For the HEMT of FIG. 5A or the MISHEMT #1 of FIG. 5B, this first dielectric layer 511 is above and immediately adjacent to the barrier layer 505. For the MISHEMT #2 of FIG. 5C, this first dielectric layer 111 is above and immediately adjacent to the gate dielectric layer 536. It should be noted that the first dielectric layer 511 can be configured essentially the same as first dielectric layer 111 described in detail above with regard to the IC structure embodiments 100A-100C.

The transistor (i.e., the HEMT 530A of FIG. 5A, the MISHEMT #1 530B of FIG. 5B and the MISHEMT #2 530C of FIG. 5C) can each include metallic source/drain regions 532-533 in source/drain openings that extend from a top surface of the first dielectric layer 511 to the channel layer 504 such that the metallic source/drain regions 532-533 are immediately adjacent to the channel layer 504. The metallic source/drain regions 532-533 can be relatively flat, essentially horizontally oriented, metallic pads or plates that are made up of a single metal or metal alloy layer or multiple metal or metal alloy layers. In some embodiments, the metallic source/drain regions 532-533 can be an ohmic contacts made of, for example, Ti/Al/TiN, Ti/Al/Ti/Au or Mo/Al/Mo/Au. In some embodiments, the metallic source/drain regions 532-533 can be essentially identical in size (i.e., in overall length, width and height). Alternatively, the metallic source/drain regions 532-533 can be different in size and/or shape. For example, the metallic source/drain regions 532-533 can include, more particularly, a metallic source region 532 and a metallic drain region 533. Both can be, for example, square, rectangular, or round in shape, but the metallic source region 532 can have a larger horizontal cross-sectional area than the metallic drain region 533.

The transistor (i.e., the HEMT 530A of FIG. 5A, the MISHEMT #1 530B of FIG. 5B and the MISHEMT #2 530C of FIG. 5C) can also include a gate structure 531 in a gate opening, which is positioned laterally between the source/drain openings, and which extends from the top surface to the bottom surface of the first dielectric layer 511.

For the HEMT 530A of FIG. 5A, the gate structure 531 can include a gate conductor layer 535 immediately adjacent to the barrier layer 505 at the bottom of the gate opening. The gate conductor layer 535 can include one or more layers of gate conductor material including metal(s) or metal alloy(s) that will form a Schottky gate contact (i.e., a potential energy barrier for electrons) at the metal-semiconductor junction at the bottom of the gate opening. Exemplary metals or metal alloys that can be employed for a Schottky contact gate terminal include, but are not limited to, gold (Au), titanium (Ti), nickel-gold (Ni—Au), or titanium-platinum-gold (Ti/Pt/Au).

For the MISHEMT #1 530B of FIG. 5B, the gate structure 531 can include a conformal gate dielectric layer 534, which lines the gate opening such that it is immediately adjacent to the barrier layer 505 at the bottom of the gate opening, and a gate conductor layer 535 on the gate dielectric layer 534. The conformal gate dielectric layer 534 can be, for example, a silicon dioxide ($SiO_2$) layer, a high K dielectric layer or a layer of any other dielectric material suitable for use as a gate dielectric layer of a MISHEMT. Exemplary high-K dielectric materials that could be employed include, but are not limited to, a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.). For the MISHEMT #2 530C of FIG. 5C, the gate structure 531 can include the portion of the gate dielectric layer 536, which is exposed at the bottom of the gate opening, and a gate conductor layer 535 on the gate dielectric layer 536. It should be noted that for MISHEMTs 530B-530C, the layer of gate conductor material will be physically separated from the barrier layer 505 at the bottom of the gate opening. Since the formation of a Schottky contact gate terminal is not required for MISHEMTs, the gate conductor layer 535 could include one or more layers of any suitable gate conductor material (e.g., gate metal(s), gate metal alloy(s), doped polysilicon, etc.).

In any case, in some IC structure embodiments (not shown), the gate structure 531 can be centered between the metallic source/drain regions 532-533. In other IC structure embodiments, the gate structure 531 can be closer to one of the metallic source/drain regions 532-533 than the other. For example, as illustrated, the gate structure 531 can be closer to the metallic source/drain region 532 (i.e., the metallic source region) than it is to the metallic source/drain region 533 (i.e., the metallic drain region).

Each of the IC structure embodiments 500A-500C can further include a second dielectric layer 512 covering the first dielectric layer 511, the metallic source/drain regions 532-533, and the gate structure 531. It should be noted that the second dielectric layer 512 can be configured essentially the same as second dielectric layer 112 described in detail above with regard to the IC structure embodiments 100A-100C.

Each of the IC structure embodiments 500A-500C can further include at least one interconnect 550 (also referred to herein as a through-metal through-substrate interconnect). Each interconnect 550 can include: a first portion 551, which is in the substrate 501 (e.g., extending from the metallic source/drain region 532 downward through the channel layer 504, the buffer layer 503 and initial substrate layer 502 to the first side 591); a second portion 552, which extends from the first portion 551 through the metallic source/drain region 532; and a third portion 553, which extends from the second portion 552 through the second dielectric layer 512 (e.g., to the top surface of the second dielectric layer 512). In some embodiments, the IC structure could include a single through-metal through-substrate interconnect with a single first portion in the substrate, a single second portion on the first portion and extending through the metallic source/drain region, and a single third portion on the single second portion and extending through the second dielectric layer (e.g., as in the IC structure embodiment 100A described in detail above). In other embodiments, the IC structure could include multiple through-metal through-substrate interconnects each with a single first portion in the substrate, a single second portion on the first portion and extending through the metallic source/drain region, and a single third portion on the single second portion and extending through the second dielectric layer (e.g., as in the IC structure embodiment 100B described in detail above or in the IC structure embodiments 500A-500C, as shown). In still other embodiments, the IC structure could include a single through-metal through-substrate interconnect with multiple first portions in the substrate, multiple second portions on the first portions, respectively, and extending through the metallic source/drain region, and a single third portion on the multiple second portions and extending through the second dielectric layer (e.g., as in the IC structure embodiment 100C described in detail above).

Optionally, in each of the IC structure embodiments 500A-500C, the third portion 553 of each interconnect 550 can be wider than any second portion 552 of the same interconnect. Furthermore, the width of any second portion 552 of each interconnect 550 can be approximately the same as the width of the first portion 551 below, as illustrated. However, as discussed in greater detail below with regard to the method, processing may result in the first portion being slightly wider or narrower than the second portion, the first portion having tapered sidewalls, etc.

In any case, in each IC structure embodiments 500A-500C, the interconnect(s) 550 can include conductive fill material(s) that fill a corresponding interconnect opening. The conductive fill material could be, for example, tungsten. Alternatively, the conductive fill material could be, for example, copper. In the case of a copper conductive fill material, the interconnect 550 would typically include: an adhesion-barrier metal layer (e.g., a titanium layer, a tantalum layer, a multi-layered structure including layers of tantalum nitride and tantalum, etc.) conformally lining the interconnect opening; a copper layer on the adhesion-barrier metal layer; and, optionally, a gold layer on the copper layer.

While not shown in the IC structure embodiments 500A-500C, optionally, each first portion 551 of each interconnect 550 can be electrically isolated from the substrate 501 by an insulator layer (e.g., similar to the insulator layer 154 discussed above with regard to FIG. 4). In any case, as illustrated in FIGS. 5A-5C, each second portion 552 of each interconnect 550 can be electrically connected to the metallic source/drain region 532. Specifically, conductive material of the interconnect 550 can be immediately adjacent to sidewalls in each portion of an interconnect opening extending through the metallic source/drain region 532 such that each interconnect 550 is in contact with and, more particularly, electrically connected to the metallic source/drain region 532.

As mentioned above, in each of the IC structure embodiments 500A-500C, each first portion 551 of an interconnect 550 extends through the multi-layered substrate 501 (i.e., each portion extends essentially from the first side 591 of the substrate 501 to the metallic source/drain region 532 on the second side 592 of the multi-layered substrate 501), as illustrated. Optionally, each of the IC structure embodiments 500A-500C can also include one or more additional metallic features in contact with the interconnect(s) 550 One such additional metallic feature 513 can be on the first side 591 of the substrate 501 immediately adjacent to the bottom 555 of each first portion 551 of each interconnect 550. The additional metallic feature 513 on the first side 591 of the substrate 501 can be, for example, a grounded metallic layer (i.e., a grounded metal or metal alloy layer), such as a grounded copper or gold film, or some other backside metallic feature requiring an electrical connection to the metallic source/drain region 532. Additionally, or alternatively, an additional metallic feature 514 can be on the second dielectric layer 512 immediately adjacent to the third portion 553 of each interconnect 550. The additional metallic feature 514 can be, for example, a back end of the line (BEOL) metal wire or via in a lowest metal level (MO) of the BEOL metal levels ($M_0$-$M_x$).

For purposes of illustration, through-metal through-substrate interconnect(s) are shown as extending through only one of the metallic source/drain regions in the IC structure embodiments 500A-500C shown in FIGS. 5A-5C. It should be understood that the figures are not intended to be limiting. Alternatively, such through-metal through-substrate interconnect(s) can extend through both metallic source/drain regions. The number and configuration of the through-metal through-substrate interconnect(s) in the different metallic source/drain regions can be the same or different.

Figure 6:
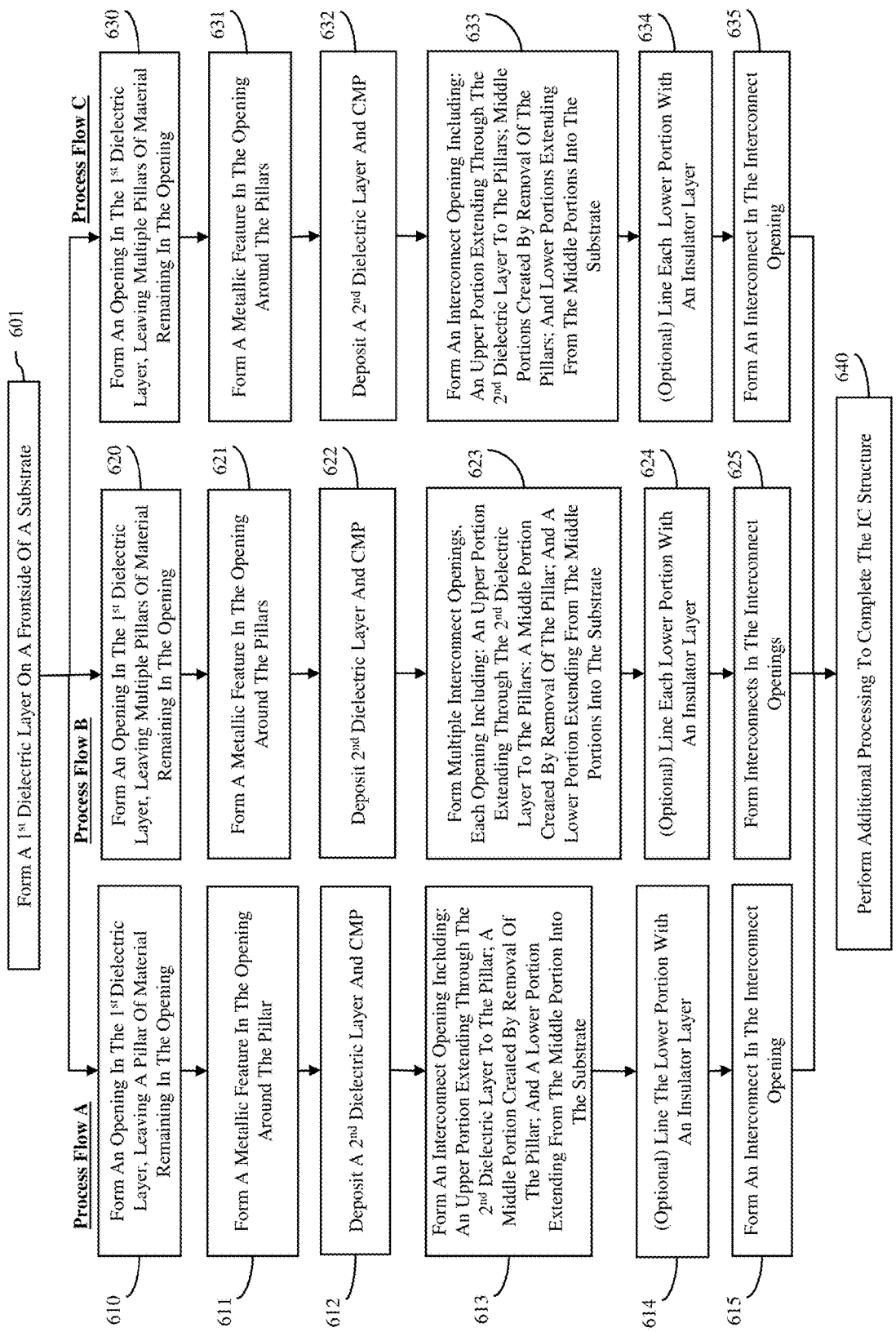
FIG. 6 is a flow diagram illustrating method embodiments for forming the above-described IC structure embodiments.

Also disclosed herein are method embodiments for forming an integrated circuit (IC) structure that includes a metallic feature and at least one through-metal through-substrate interconnect extending through that metallic feature. FIG. 6 is a flow diagram illustrating exemplary process steps that can be employed for forming the through-metal through-substrate interconnect (s) described above shown in the structures of FIGS. 1A-1C, FIGS. 2A-2C, and FIGS. 3A-3C.

Each of the method embodiments can include forming or otherwise acquiring a substrate 101. The substrate could be a single-layered substrate such as a bulk semiconductor substrate (e.g., a bulk silicon substrate). Alternatively, the substrate could be a multi-layered substrate such as a semiconductor-on-insulator substrate (e.g., a silicon-on-insulator substrate) that includes an initial substrate layer (e.g., a silicon or other initial substrate layer), an insulator layer (e.g., an oxide layer or other insulator layer) on the initial substrate layer, and a semiconductor layer (e.g., a silicon layer) on the insulator layer. Alternatively, the substrate could be some other type of multi-layered substrate such as a substrate that includes multiple different epitaxial semiconductor layers that are required for the formation of, for example, a high electron mobility transistor (HEMT) or a metal-insulator-semiconductor high electron mobility transistor (MISHEMT) (e.g., see also the discussion below regarding the formation of IC structures 500A-500C shown in FIGS. 5A-5C wherein the metallic feature through which the through0metal through-substrate interconnect extends is specifically a metallic source/drain region of a HEMT or MISHEMT). In any case, the substrate 101 can have a first side 191 (also referred to herein as a backside or bottom surface) and a second side 192 (also referred to herein as a frontside or top surface), which is opposite the first side 191.

Each of the method embodiments can further include forming (e.g., depositing) a first dielectric layer 111 on the second side 192 of the substrate (see process step 601). The first dielectric layer can include one or more relatively thin layers (thin films) of dielectric material (e.g., silicon dioxide, silicon nitride, etc.).

Each of the method embodiments can further include forming a metallic feature 132 such that it is embedded in the first dielectric layer 111 and at least one through-metal through-substrate interconnect that extends through that metallic feature 132 into the substrate 101. It should be noted that the process flow will vary slightly depending upon whether one through-metal through-substrate interconnect 150 will extend through the metallic feature 132 (e.g., as shown in FIGS. 1A-1C) (see process flow A, process steps 610-616 and FIGS. 7A(1)-(2) to 7E), whether more than one through-metal through-substrate interconnects 150 will extend through the metallic feature 132 (e.g., as shown in FIGS. 2A-2C) (see process flow B, process steps 620-626, and FIGS. 8A(1)-(2) to 8E), and whether each through-metal through-substrate interconnect 150 will have multiple portions that extend through the metallic feature 132 and into the substrate 101 (e.g., as shown in FIGS. 3A-3C) (see process flow C, process steps 630-636, and FIGS. 9A(1)-(2) to 9E).

Specifically, the method can include forming a metallic feature opening that extends through the first dielectric layer 111 to (or into) the second side 192 of the substrate 101 (see process step 610 of process flow A, see process step 620 of process flow B, and process step 630 of process flow C)).

In each case, the metallic feature opening 730, 830, 930 can be formed (e.g., lithographically patterned and etched) such that at least one pillar of material that remains within the metallic feature opening (see the pillar 740 in the metallic feature opening 730 shown in the vertical and horizonal cross-section diagrams of FIGS. 7A(1)-(2), see the pillars 840 in the metallic feature opening 830 shown in the vertical and horizonal cross-section diagrams of FIGS. 8A(1)-(2), and see the pillars 940 in the metallic feature opening 930 shown in the vertical and horizonal cross-section diagrams of FIGS. 9A(1)-(2)). In any case, each pillar 740, 840, 940 can include a dielectric section comprising a portion of the first dielectric layer and, if the metallic feature opening 730, 830, 930 extends into the second side 192 of the substrate 101 (as illustrated), a substrate section below the dielectric section comprising a portion of the substrate.

A metallic feature 132 can subsequently be formed within the metallic feature opening 730, 830, 930 so as to laterally surround around the pillar(s) 740, 840, 940 (see process step 611 and the metallic feature shown in the vertical and horizontal cross-section diagrams of FIGS. 7B(1)-(2), see process step 621 and the metallic feature shown in the vertical and horizontal cross-section diagrams of FIGS. 8B(1)-(2), and see process step 631 and the metallic feature shown in the vertical and horizontal cross-section diagrams of FIGS. 9B(1)-(2)). In each case, the metallic feature 132 can be formed, for example, by forming one or more layers of metal or metal alloy materials (e.g., by any suitable thin film deposition technique such as physical or chemical vapor deposition) and subsequently patterning the layer(s) or otherwise removing the metallic material entirely from the top surface of the dielectric layer (as shown) or from all but the edge of the metallic feature opening. Thus, the resulting metallic feature 132 can be a relatively flat, metallic pad or plate within the metallic feature opening. However, depending upon the process techniques used to form the metallic feature 132 and/or used during downstream processing the top surface of the metallic feature 132 may be at a level above the top surface of the top surface of the first dielectric layer 111 (as shown), may be co-planar with the top surface of the first dielectric layer 111 (not shown) or may be below the top surface of the first dielectric layer 111 (not shown). Alternatively, the resulting metallic feature 132 could be essentially T-shaped with a narrow portion within the metallic feature opening and a wider portion above and extending laterally onto the first dielectric layer 111 at the edge of the metallic feature opening (not shown). In any case, the metallic feature 132 can be made up of a single metal or metal alloy layer or multiple metal or metal alloy layers. In some embodiments, the metallic feature 132 can be formed by depositing metal/metal alloy stacks such as Ti/Al/TiN. Ti/Al/Ti/Au or Mo/Al/Mo/Au in order to form an ohmic contact.

Each of the method embodiments can further include forming (e.g., depositing) a second dielectric layer 112 over the first dielectric layer 111 and the metallic feature 132 (sec process step 612, 622, or 632). The second dielectric layer 112 can include one or more layers interlayer dielectric material (e.g., silicon dioxide, silicon nitride, etc.). Formation of the second dielectric layer 112 can be followed by polishing process (e.g., a chemical mechanical polishing (CMP) process) to ensure that the top surface of the second dielectric layer 112 is essentially parallel to the first side 191 of the substrate 101.

Figure 8D:
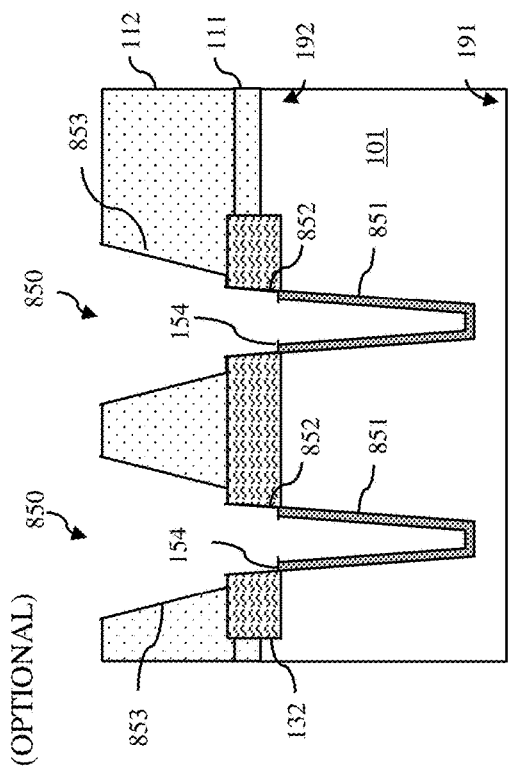
FIGS. 8A(1)-(2) to 8E are cross-section diagrams illustrating partially completed IC structures formed during process steps 620-625 of process flow B of FIG. 6.
Figure 8C:
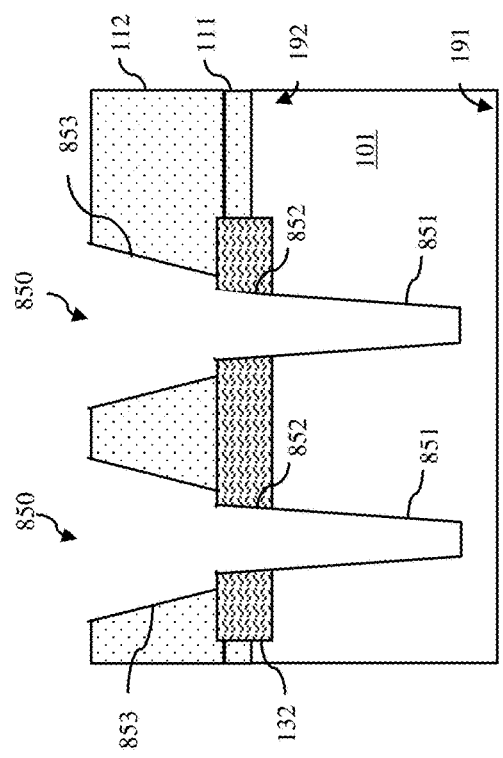

Each of the method embodiments can further include forming at least one interconnect opening (see process step 613 and the interconnect opening 750 of FIG. 7C, sec process step 623 and the interconnect openings 850 of FIG. 8C, and see process step 633 and the interconnect opening 950 of FIG. 9C.

For example, at process step 613 (shown in FIG. 7C), an upper portion 753 of the interconnect opening 750 can be formed (e.g., lithographically patterned and etched using an anisotropic etch process selective to the dielectric material (s) of the second dielectric layer) such that the upper portion 753 of the interconnect opening 750 extends through the second dielectric layer 112 to the metallic feature 132 and exposes the top of the pillar 740. It should be noted that this selective etch process can at least begin to form a middle portion 752 of the interconnect opening by also selectively removing the dielectric section of the pillar 740. Using the metal feature 132 effectively as a mask, one or more anisotropic etch processes selective to the material(s) of the substrate 101 can subsequently be performed in order to remove any remaining substrate section of the pillar 740 in order to complete formation of the middle portion 752 of the interconnect opening 750 and to further form a lower portion 751 of the interconnect opening 750 that extends into the substrate 101 from the second side 192 toward the first side 191.

For example, at process step 623 (shown in FIG. 8C), discrete upper portions 853 of discrete interconnect openings 850 can be formed (e.g., lithographically patterned and etched using an anisotropic etch process selective to the dielectric material(s) of the second dielectric layer) such that each upper portion 853 extends through the second dielectric layer 112 to the metallic feature 132 and exposes the top of a corresponding pillar 840. This selective etch process can at least begin to form discrete middle portions 852 of the interconnect openings by also selectively removing the dielectric section of each pillar 840. Using the metal feature 132 effectively as a mask, one or more anisotropic etch processes selective to the material(s) of the substrate 101 can subsequently be performed in order to remove any remaining substrate section of each pillar 840 in order to complete formation of the middle portions 852 of the interconnect openings 850, respectively, and to further form lower portions 851 for the interconnect openings 850, where each lower portion 851 extends from a corresponding middle portion 852 into the substrate 101 toward the first side 191.

For example, at process step 633 (shown in FIG. 9C), an upper portion 953 of the interconnect opening 950 can be formed (e.g., lithographically patterned and etched using an anisotropic etch process that is selective to the dielectric material(s) of the second dielectric layer 112) such that the upper portion 953 of the interconnect opening 950 extends through the second dielectric layer 112 to the metallic feature 132 and exposes the tops of the pillars 940. It should be noted that this selective etch process can at least begin to form discrete middle portions 952 of the interconnect opening by also selectively removing the dielectric section of each pillar 940. Using the metal feature 132 effectively as a mask, one or more anisotropic etch processes selective to the material(s) of the substrate 101 can subsequently be performed in order to remove any remaining substrate section of each pillar 940 in order to complete formation of the middle portions 952 of the interconnect opening 950 and to further form lower portions 951 of the interconnect opening 950, where each lower portion 951 extends from a corresponding middle portion 952 into the substrate 101 toward the first side 191.

The lower portion(s) of each interconnect opening can be etched so that the bottom close to, but some distance above, the first side 191. Optionally, the lower portion(s) of each interconnect opening could be etched so as to extend into the substrate to a device (e.g., a capacitor, resistor, etc.) previously formed and embedded within the substrate (not shown). Such would be the case for the formation of, for example, the IC structure embodiment shown in FIG. 4 and described above. In any case, it should be noted that the horizontal cross-sectional area (e.g., length by width) and shape of the metallic feature opening 730, 830, or 930 formed at process step 610, 620 or 630, respectively, will define the horizontal cross-sectional area and shape of the metallic feature 132 formed during process step 611, 621 or 631. Furthermore, the horizontal cross-sectional area (e.g., length by width) and shape of any pillar(s) 740, 840, 940 remaining within the opening 730, 830, 930 can define the horizontal cross-sectional area (e.g., length by width) and shape of the through-hole(s) (i.e., the middle portion(s) of each interconnect opening) formed by removal of the pillar (s) at process step 613, 623, 633.

Optionally, each of the method embodiments can further include lining the lower portion(s) 751, 851, 951 of each interconnect opening 750, 850, 950 with an insulator layer 154 in order to electrically isolate any interconnect subsequently formed therein from the substrate 101 (see optional process step 614 and FIG. 7D, optional process step 624 and FIG. 8D, and optional process step 634 and FIG. 9D). For example, a thin insulator layer could be conformally deposited (e.g., by atomic layer deposition or plasma-enhanced atomic layer deposition) over the partially completed structure, thereby lining the interconnect opening. This insulator layer 154 could be, for example, a silicon dioxide layer, a conformal silicon nitride layer, or some other suitable conformal insulator layer. A protective fill material (also referred to herein as a sacrificial fill material) could be deposited onto the insulator layer so as to only fill the lower portion(s) of teach interconnect opening or could be deposited and subsequently recessed so that it only remains in the lower portion(s). It should be noted that ideally the insulator layer 154 would be made of a different material than that that of the dielectric layers 111-112 so that the insulator layer 154 could be removed from the sidewalls of the upper and middle portion(s) of each interconnect opening without significantly impacting the dielectric layers 111-112. The protective fill material can then be removed (e.g., by a selective isotropic etch process). Optionally, a selective anisotropic etch process could be performed in order to also remove material of the insulator layer 154 from the bottom of the lower portion(s) of each interconnect opening (not shown). Alternatively, the material of the insulator layer 154 can be removed from the bottom of the lower portion(s) of each interconnect opening during subsequent processing (e.g., during backside of the substrate grounding at process step 640 discussed in greater detail below).

Figure 8E:
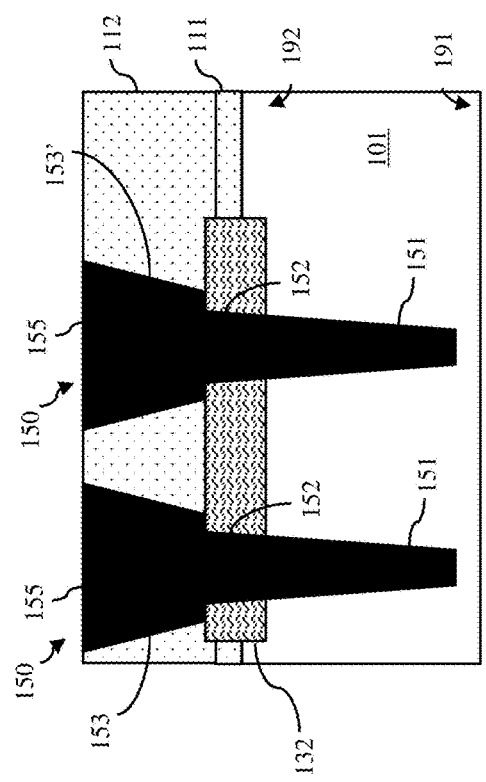

Each of the method embodiments can further include forming an interconnect 150 (also referred to herein as a through-metal through-substrate interconnect) in each interconnect opening 750, 850, 950 (see process step 615 and FIG. 7E, process step 625 and FIG. 8E, and see process step 635 and FIG. 9E). Specifically, each interconnect 150 can be formed in a corresponding interconnect opening 750, 850, 950 so as to include: first portion(s) 151 in the lower portion(s) 751, 851, 951 of the interconnect opening 750, 850, 950; second portion(s) 152 in the middle portion(s) 752, 852, 952 of the interconnect opening 750, 850, 950 in direct contact with the metallic feature 132; and a third portion 153 in the upper portion 753, 853, 953 of the interconnect opening 750, 850, 950. Formation of each interconnect 150 can optionally include formation of conformal adhesive and/or barrier layers that line the corresponding interconnect opening. Formation of each interconnect 150 can further include filling remaining space within the interconnect opening with a least one conductive fill material, such as a metal or metal alloy fill material. The adhesion and/or barrier layers can include, for example, a titanium layer, a tantalum layer, a multi-layered structure including layers of tantalum nitride and tantalum, or any other single or multi-layered structure suitable for adhering the fill material to the structure and/or for preventing electromigration of metal ions into the substrate. The conductive fill material could be, for example, tungsten, aluminum, copper, gold, cobalt, nickel or any other conductive fill material typically used to fill a TSV. The optimal techniques for forming adhesion and/or barrier layers that line an interconnect opening and for filling remaining spaces within the interconnect opening with conductive fill material will vary depending upon the types of materials used. Such techniques are well known in the art and, thus, the details have been omitted from this specification in order to allow the reader to focus on the salient aspects of the disclosed methods.

For purposes of illustration, process step 615 of FIG. 7E, process step 625 of FIG. 8E, and process step 635 of FIG. 9E are each shown with respect to a partially completed IC structure that does not include an optional insulator layer 154. However, it should be understood that such processing could also be performed with respect to a partially completed IC structure that does include an optional insulator layer 154 lining the first portion(s) of each interconnect opening so that each first portion of each interconnect is electrically isolated from the substrate.

Following formation of the interconnect(s), a polishing process (e.g., a chemical mechanical polishing (CMP) process can be performed in order to remove any of the materials used to form the interconnect(s) from the top surface of the second dielectric layer 112. Then additional processing can be performed in order to complete the IC structure (see process step 640).

As illustrated in the IC structure 100A of FIGS. 1A-1C, 100B of FIGS. 2A-2C, 100C of FIGS. 3A-3C, this additional processing can include the formation of one or more additional metallic features adjacent to the bottom of the first portion(s) of an interconnect and/or to the top of the third portion of an interconnect. Specifically, back end of the line (BEOL) metals levels ($M_0$-$M_x$) can be formed adjacent to the top surface of the second dielectric layer 112. Optionally, the formation of the BEOL metal levels can include formation of at least one additional metallic feature 114 (e.g., a metal wire) in the first metal level (Mo) immediately adjacent to (i.e., in contact with) the top surface of the third portion 153, 153, 153 of an interconnect 150. BEOL metal level processing techniques are well known in the art and, thus, the details have been omitted from this specification in order to allow the reader to focus on the salient aspects of the disclosed embodiments. Additionally, or alternatively, during backside of the substrate grounding, the bottom of the first portion(s) 151 of an interconnect 150 can be exposed. Then, an additional metallic feature 113 (e.g., a grounded metal or metal alloy wire or some other metallic feature requiring connection to the metallic feature 132) can be formed (e.g., deposited and patterned) on the first side 191 of the substrate 101 immediately adjacent to (i.e., in contact with) the bottom 155 of the first portion(s) 151 of the interconnect 150.

As mentioned above, the method embodiments are described above and illustrated in the drawings with respect to the IC structure embodiments shown in FIGS. 1A-1C, 2A-2C and 3A-3C. It should be understood that these same techniques could be integrated into the conventional processing techniques used form devices that include one or more metallic features and that could benefit from the inclusion of a through-metal through-substrate interconnect as described. For example, these same techniques could be integrated into the processing techniques used form high electron mobility transistor (HEMT) or a metal-insulator-semiconductor high electron mobility transistor (MISHEMT) because such HEMT or MISHEMT devices (e.g., as shown in the IC structure embodiments 500A-500C of FIGS. 5A-5C and described in detail above) could benefit from the reduced resistance/quick connection to ground that could be provided by a through-metal through-substrate interconnect 550 extending through at least one of the metallic source/drain regions 532-533. In this case, processing of the HEMT or MISHEMTs would be essentially the same as prior art HEMT or MISHEMT processing (including the formation of a gate structure that extends through a first dielectric layer to a barrier layer of a multi-layered substrate and the formation of metallic source/drain regions that extend through the first dielectric layer and the barrier layer to a channel region of the multi-layered substrate) except for the following. Instead of forming solid metallic source/drain regions, at least one of the metallic source/drain regions (e.g., the metallic source/drain region 532) would be formed so as to laterally surround pillar(s) of material as described in detail above with respect to process steps 610-611, 620-621, or 630-631. Then, a second dielectric layer would be formed over the partially completed structure in essentially the same manner as described in detail above with respect to process steps 612, 622, or 632 and a through-metal through-substrate interconnect would be formed extending through the metallic source/drain region in essentially the same manner as described in detail above with respect to process steps 613-615, 623-625, or 633-635. Finally, the one or more additional metallic features could be formed adjacent to the bottom of the interconnect on the backside of the substrate and/or adjacent to the top of the interconnect in the BEOL metal levels in essentially the same manner as described in detail above with respect to process step 640.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant (s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact". "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate having a first side and a second side opposite the first side;
   a first dielectric layer adjacent to the second side;
   a metallic feature in a metallic feature opening extending through the first dielectric layer;
   a second dielectric layer on the metallic feature and the first dielectric layer;
   an interconnect in an interconnect opening,
      wherein the interconnect opening includes a lower portion extending from the first side of the substrate to the metallic feature, a middle portion extending from the lower portion through the metallic feature, and an upper portion extending from the middle portion through the second dielectric layer to a top surface of the second dielectric layer,
      wherein a top of the interconnect is co-planar with the top surface of the second dielectric layer,
      wherein the interconnect includes a conductive fill material within the interconnect opening extending continuously through the lower portion, the middle portion, and the upper portion, and
      wherein, within the middle portion of the interconnect opening, the interconnect is in direct contact with and electrically connected to the metallic feature; and
   an additional metallic feature, wherein a bottom surface of the additional metallic feature is in contact with the top of the interconnect and extends onto the top surface of the second dielectric layer.

2. The structure of claim 1, wherein the structure further comprises a metallic film on the first side of the substrate immediately adjacent to the interconnect.

3. The structure of claim 1, wherein the upper portion is wider than the middle portion.

4. The structure of claim 1, further comprising: an insulator layer in the lower portion of the interconnect opening and electrically isolating the interconnect from the substrate.

5. The structure of claim 1, further comprising an additional interconnect, wherein the additional interconnect is physically separated from any adjacent interconnects, is within an additional interconnect opening that extends from the first side of the substrate through the metallic feature and further through the second dielectric layer, and is in direct contact with and electrically connected to the metallic feature.

6. The structure of claim 1, wherein the interconnect further comprises at least one of an adhesive layer and a barrier layer lining sidewalls of the interconnect opening and the conductive fill material filling remaining space within the interconnect opening.

7. A structure comprising:
   a multi-layered substrate having a first side and a second side opposite the first side, wherein the multi-layered substrate comprises: a channel layer; and a barrier layer on the channel layer;
   a first dielectric layer on the barrier layer;
   a transistor comprising:
      metallic source/drain regions in source/drain openings, respectively, wherein the source/drain openings extend from a top surface of the first dielectric layer to the channel layer and wherein the metallic source/drain regions are immediately adjacent to the channel layer; and
      a gate structure in a gate opening, wherein the gate opening is positioned laterally between the source/drain openings and extends from the top surface of the first dielectric layer to a bottom surface of the first dielectric layer;
   a second dielectric layer on the first dielectric layer, the metallic source/drain regions, and the gate structure;
   at least one contact extending vertically from the transistor to a top surface of the second dielectric layer;
   an interconnect in an interconnect opening,
      wherein the interconnect opening includes a lower portion extending from the first side of the multi-layer substrate to one metallic source/drain region of the metallic source/drain regions, a middle portion extending from the lower portion through the one metallic source/drain region, and an upper portion extending from the middle portion through the second dielectric layer to the top surface of the second dielectric layer,
      wherein top surfaces of the contact and the interconnect are co-planar with the top surface of the second dielectric layer,
      wherein the interconnect includes a conductive fill material within the interconnect opening extending continuously from the first side of the multi-layer substrate through the lower portion, the middle portion, and the upper portion, and
      wherein, within the middle portion of the interconnect opening, the interconnect is in direct contact with and electrically connected to the one metallic source/drain region; and
   an additional metallic feature, wherein a bottom surface of the additional metallic feature is in contact with a top surface of the interconnect and extends onto the top surface of the second dielectric layer.

8. The structure of claim 7, further comprising a metallic film on the first side of the multi-layered substrate immediately adjacent to the interconnect.

9. The structure of claim 7, wherein the upper portion is wider than the middle portion.

10. The structure of claim 7, wherein the gate structure comprises a gate conductor layer in the gate opening immediately adjacent to the barrier layer.

11. The structure of claim 7,
   wherein the transistor comprises a metal-insulator-semiconductor high electron mobility transistor, and
   wherein the gate structure comprises: a gate dielectric layer immediately adjacent to the barrier layer and a gate conductor layer on the gate dielectric layer.

12. The structure of claim 7,
   wherein the multi-layered substrate further comprises: an initial semiconductor substrate layer; a buffer layer on the initial semiconductor substrate layer; and the channel layer on the buffer layer,
   wherein the buffer layer, the channel layer, and the barrier layer comprise epitaxial semiconductor layers on the initial semiconductor substrate layer,
   wherein the interconnect further includes at least one of an adhesive layer and a barrier layer lining sidewalls of the interconnect opening and the conductive fill material filling remaining space within the interconnect opening, and
   wherein the structure further comprises: an insulator layer in the lower portion of the interconnect opening electrically isolating the interconnect from the initial semiconductor substrate layer, from the buffer layer, and from the channel layer.

13. The structure of claim 7, further comprising: an additional interconnect, wherein the additional interconnect is physically separated from any adjacent interconnects, is within an additional interconnect opening that extends from the first side of the multi-layer substrate through the one metallic source/drain region and further through the second dielectric layer, and includes the conductive fill material extending continuously from the first side of the multi-layered substrate through the second dielectric layer.

14. The structure of claim 7, wherein the metallic source/drain regions include two metallic source/drain regions including: a metallic source region and a metallic drain region, and wherein the metallic source region has a larger surface area than the metallic drain region and is closer to the gate structure than the metallic drain region.

15. The structure of claim 8, wherein the conductive fill material is different from metallic materials of the metallic film and the additional metallic feature.

16. The structure of claim 8, wherein the conductive fill material is tungsten.

17. A structure comprising:
   a multi-layered substrate having a first side and a second side opposite the first side, wherein the multi-layered substrate comprises: a channel layer; and a barrier layer on the channel layer;
   a first dielectric layer on the barrier layer;
   a transistor comprising:
      a source region extending through the first dielectric layer and the barrier layer toward the channel layer;
      a drain region extending through the first dielectric layer and the barrier layer toward the channel layer; and
      a gate structure positioned laterally between the source region and the drain region and further extending through the first dielectric layer to the barrier layer;
   a second dielectric layer over the first dielectric layer, the source region, the drain region, and the gate structure;
   contacts extending vertically from the drain region and the gate structure to a top surface of the second dielectric layer;

at least one interconnect including conductive fill material extending continuously from the first side of the multi-layered substrate, through the source region, to the top surface of the second dielectric layer,
  wherein the at least one interconnect is immediately adjacent and electrically connected to the source region, and
  wherein top surfaces of the contacts and the at least one interconnect are co-planar with the top surface of the second dielectric layer; and
a metallic film on the first side of the multi-layered substrate immediately adjacent to the at least one interconnect; and
a back end of the line (BEOL) wire, wherein a bottom surface of the BEOL wire is in contact with the at least one interconnect and extends onto the top surface of the second dielectric layer.

18. The structure of claim 17, wherein the conductive fill material is different from metallic materials of the metallic film and the BEOL wire.

19. The structure of claim 17, wherein the at least one interconnect includes multiple interconnects.

20. The structure of claim 18, wherein the BEOL wire extends laterally across and is in contact with all of the multiple interconnects.

* * * * *